(12) United States Patent
Mori

(10) Patent No.: US 9,389,345 B2
(45) Date of Patent: Jul. 12, 2016

(54) OPTICAL ELEMENT, ILLUMINATION DEVICE, MEASUREMENT APPARATUS, PHOTOMASK, EXPOSURE METHOD, AND DEVICE MANUFACTURING METHOD

(71) Applicant: NIKON CORPORATION, Tokyo (JP)

(72) Inventor: Daisuke Mori, Hiratsuka (JP)

(73) Assignee: NIKON CORPORATION, Tokyo (JP)

( * ) Notice: Subject to any disclaimer, the term of this patent is extended or adjusted under 35 U.S.C. 154(b) by 70 days.

(21) Appl. No.: 14/030,586

(22) Filed: Sep. 18, 2013

(65) Prior Publication Data

US 2014/0017603 A1   Jan. 16, 2014

Related U.S. Application Data

(63) Continuation of application No. PCT/JP2012/057354, filed on Mar. 22, 2012.

(30) Foreign Application Priority Data

Mar. 22, 2011 (JP) ................. 2011-062411

(51) Int. Cl.
*G03F 1/50* (2012.01)
*G02B 5/00* (2006.01)
*G03F 7/20* (2006.01)

(52) U.S. Cl.
CPC ....... *G02B 5/008* (2013.01); *G03F 1/50* (2013.01); *G03F 7/2045* (2013.01); *G03F 7/706* (2013.01); *G03F 7/7015* (2013.01)

(58) Field of Classification Search
CPC .................................. G02B 5/008; G03F 1/50
USPC ................................................................ 430/5
See application file for complete search history.

(56) References Cited

U.S. PATENT DOCUMENTS

| 5,448,332 A | 9/1995 | Sakakibara et al. |
| 5,859,707 A | 1/1999 | Nakagawa et al. |

(Continued)

FOREIGN PATENT DOCUMENTS

| EP | 1 079 223 A1 | 2/2001 |
| EP | 1 796 142 A1 | 6/2007 |

(Continued)

OTHER PUBLICATIONS

Apr. 24, 2012 International Search Report issued in International Application No. PCT/JP2012/057354 (with translation).

(Continued)

*Primary Examiner* — Stephen Rosasco
(74) *Attorney, Agent, or Firm* — Oliff PLC

(57) ABSTRACT

An optical element includes: an incident surface irradiated with irradiation light; an emission surface of which at least a part faces a direction opposite to the incident surface; and a metal film having a hole to connect the incident surface and emission surface. The incident surface includes a first surface, disposed around an end of the hole on the incident surface side and having an inner edge connected to an inner surface of the hole, and a second surface disposed around the first surface forming a discontinuous portion between the second surface and an outer edge of the first surface. The distance between the inner and outer edges is determined by a wavelength of surface plasmons such that an intensity of light is increased due to interference between surface plasmons, excited at the inner edge by the irradiation light, and surface plasmons traveling from the discontinuous portion.

24 Claims, 24 Drawing Sheets

(56) References Cited

U.S. PATENT DOCUMENTS

| | | |
|---|---|---|
| 2004/0252311 A1 | 12/2004 | Ishii et al. |
| 2009/0252002 A1 | 10/2009 | Ueyanagi et al. |
| 2011/0063717 A1 | 3/2011 | Consonni et al. |

FOREIGN PATENT DOCUMENTS

| | | |
|---|---|---|
| JP | A-06-283403 | 10/1994 |
| JP | A-09-219354 | 8/1997 |
| JP | A-2001-256664 | 9/2001 |
| JP | A-2006-040347 | 2/2006 |
| JP | A-2006-351091 | 12/2006 |
| WO | WO 99/60361 A1 | 11/1999 |
| WO | WO 03/029751 A1 | 4/2003 |
| WO | WO 2006/016584 A1 | 2/2006 |
| WO | WO 2009/141353 A1 | 11/2009 |

OTHER PUBLICATIONS

Apr. 24, 2012 Written Opinion Issued in International Application No. PCT/JP2012/057354 (with translation).

Dec. 1, 2015 Office Action issued in Japanese Application No. 2013-506003.

May 17, 2016 Office Action issued in Japanese Application No. 2013-506003.

OPTICAL ELEMENT, ILLUMINATION DEVICE, MEASUREMENT APPARATUS, PHOTOMASK, EXPOSURE METHOD, AND DEVICE MANUFACTURING METHOD

CROSS-REFERENCE TO RELATED APPLICATION

This is a Continuation application of International Application No. PCT/JP2012/057354, filed Mar. 22, 2012, which claims priority on Japanese Patent Application No. 2011-062411, filed Mar. 22, 2011. The contents of the aforementioned applications are incorporated herein by reference.

BACKGROUND

1. Field of the Invention

The present invention relates to an optical element, an illumination device, a measurement apparatus, a photomask, an exposure method, and a device manufacturing method.

2. Background

A process of manufacturing a micro device such as a semiconductor device or an electronic device employs an exposure apparatus that exposes a substrate with exposure light emitted from a projection optical system. The exposure apparatus includes a measurement apparatus that measures, for example, optical characteristics of the projection optical system. As the measurement apparatus, for example, as is disclosed in PCT International Publication No. WO2003/029751, a wavefront aberration measurement apparatus, which measures the wavefront aberration of the projection optical system, is known. The wavefront aberration measurement apparatus includes an optical element which has a hole (pinhole) functioning as a quasi point light source. In addition, the apparatus generates spherical waves by irradiating the optical element with irradiation light, and measures a wavefront geometry.

SUMMARY

In the optical element, when the size of the hole is small, the spherical waves are suitably generated. In contrast, when the size of the hole is small, it is difficult for the irradiation light to be transmitted therethrough, and there is a possibility that the intensity of the spherical wave decreases. As a result, there is a possibility that the performance of the measurement apparatus is deteriorated. For example, it may take time to perform the measurement, or it may become easily affected by noise.

Further, in a case where the optical element having a hole (pinhole) is used as a photomask, when the intensity of the light which is emitted from the photomask decreases, there is a possibility that exposure failure occurs. For example, it may take time to perform the exposure, or it may become easily affected by noise. As a result, there is a possibility that defective devices may be formed.

An object of an aspect of the present invention is to provide an optical element and an illumination device capable of generating desired spherical waves. An object of another aspect of the present invention is to provide a measurement apparatus capable of preventing the performance from being deteriorated. An object of a further aspect of the present invention is to provide a photomask capable of generating desired spherical waves. An object of a still further aspect of the present invention is to provide an exposure method capable of preventing exposure failure from occurring. An object of yet a further aspect of the present invention is to provide a device manufacturing method capable of preventing defective devices from being formed.

According to a first aspect of the present invention, there is provided an optical element including: an incident surface that is irradiated with irradiation light; an emission surface of which at least a part faces a direction opposite to the incident surface; and a metal film that has a hole formed to connect the incident surface and the emission surface, in which the incident surface includes a first surface, which is disposed around an end of the hole on the incident surface side and has an inner edge connected to an inner surface of the hole, and a second surface which is disposed around the first surface and forms a discontinuous portion between the second surface and an outer edge of the first surface, and in which the distance between the inner edge and the outer edge is determined depending on a wavelength of surface plasmons such that an intensity of light, which is emitted from the hole to the emission surface side, is increased due to interference between surface plasmons, which are excited at the inner edge due to the irradiation of the irradiation light and travel toward the hole, and surface plasmons which travel from the discontinuous portion toward the hole.

According to a second aspect of the present invention, there is provided an optical element including: an incident surface that is irradiated with irradiation light; an emission surface of which at least a part faces a direction opposite to the incident surface; and a metal film that has a hole formed to connect the incident surface and the emission surface, in which the incident surface includes a first surface, which is disposed around an end of the hole on the incident surface side and has an inner edge connected to an inner surface of the hole, and a second surface which is disposed around the first surface and forms a discontinuous portion between the second surface and an outer edge of the first surface, in which the inner edge includes a first corner which is formed by the first surface and the inner surface of the hole, in which the discontinuous portion includes a second corner which is formed by the first surface and the second surface, in which the second surface is disposed around the first surface so as to face the inner side with respect to a radial direction centered on the hole, in which the optical element further includes a transparent member that is capable of transmitting the irradiation light and has a surface on which the metal film is formed, in which the metal film is made of aluminum, in which the transparent member is made of silica glass, in which when a distance between the inner edge and the outer edge is L, the following condition is satisfied: $L = m \cdot 43$ (nm) (m is a positive odd number), and in which the metal film is irradiated with the irradiation light through the transparent member.

According to a third aspect of the present invention, there is provided an optical element including: an incident surface that is irradiated with irradiation light; an emission surface of which at least a part faces a direction opposite to the incident surface; and a metal film that has a hole formed to connect the incident surface and the emission surface, in which the incident surface includes a first surface, which is disposed around an end of the hole on the incident surface side and has an inner edge connected to an inner surface of the hole, and a second surface which is disposed around the first surface and forms a discontinuous portion between the second surface and an outer edge of the first surface, in which the inner edge includes a first corner which is formed by the first surface and the inner surface of the hole, in which the discontinuous portion includes a second corner which is formed by the first surface and the second surface, in which the second surface is disposed around the first surface so as to face the outer side with respect to a radial direction centered on the hole, and in which the optical element further includes a transparent member that is capable of transmitting the irradiation light and has a surface on which the metal film is formed, in which the metal film is made of aluminum, in which the transparent member is made of silica glass, in which when a distance between the inner edge and the outer edge is L, the following condition is satisfied: L=m·43 (nm) (m is a positive even number), and in which the metal film is irradiated with the irradiation light through the transparent member.

According to a fourth aspect of the present invention, there is provided an illumination device including: the optical element according to any one of the first to third aspects; and an optical system that irradiates the incident surface of the optical element with the irradiation light, in which an object is illuminated with light which is emitted from the hole of the optical element.

According to a fifth aspect of the present invention, there is provided a measurement apparatus including: the illumination device according to the fourth aspect; a detection device that detects reflected light of spherical waves which is emitted from the illumination device and with which a surface of an object is irradiated; and an arithmetic device that calculates a wavefront aberration of the surface of the object on the basis of a detection result of the detection device.

According to a sixth aspect of the present invention, there is provided a measurement apparatus including: the illumination device according to the fourth aspect; a detection device that detects measurement light which is emitted from the illumination device and travels through an object; and an arithmetic device that calculates the optical characteristics of the object on the basis of a detection result of the detection device.

According to a seventh aspect of the present invention, there is provided a photomask including: an incident surface that is irradiated with exposure light; an emission surface of which at least a part faces a direction opposite to the incident surface; and a metal film that has a hole formed to connect the incident surface and the emission surface, in which the incident surface includes a first surface, which is disposed around an end of the hole on the incident surface side and has an inner edge connected to an inner surface of the hole, and a second surface which is disposed around the first surface and forms a discontinuous portion between the second surface and an outer edge of the first surface, and in which the distance between the inner edge and the outer edge is determined depending on a wavelength of surface plasmons such that the intensity of the exposure light, which is emitted from the hole to the emission surface side, is increased due to interference between surface plasmons, which are excited at the inner edge due to the irradiation of the exposure light and travel toward the hole, and surface plasmons which travel from the discontinuous portion toward the hole.

According to an eighth aspect of the present invention, there is provided an exposure method including: illuminating the photomask according to the seventh aspect with exposure light; and exposing a substrate with the exposure light from the photomask.

According to a ninth aspect of the present invention, there is provided a device manufacturing method including: exposing a substrate in the exposure method according to the eighth aspect; and developing the exposed substrate.

According to a tenth aspect of the present invention, there is provided an exposure apparatus that transfers a pattern image onto a substrate, the exposure apparatus including: the optical element; an optical system that irradiates the optical element with light; and a detection device that detects light which is emitted from the optical element.

According to an eleventh aspect of the present invention, there is provided an exposure method including: measuring predetermined optical characteristics by using the optical element; and transferring a pattern image onto a substrate on the basis of a measurement result of the optical characteristics.

According to a twelfth aspect of the present invention, there is provided an exposure apparatus including: a light source; a projection optical system; and an optical element that is irradiated with light emitted from the light source, in which the optical element includes a hole through which the light is transmitted, a surface which surrounds the hole and intersects with an axis direction of the hole, and two corners which are disposed near the hole and are connected by the surface and at which surface plasmons excited at each corner due to the irradiation of the light interfere with each other.

According to a thirteenth aspect of the present invention, there is provided an exposure apparatus including: a light source; a projection optical system; and an optical element that is irradiated with light emitted from the light source, in which the optical element includes a hole through which the light is transmitted, and a multilevel structure, which has two corners disposed near the hole, each corner surrounding the hole, and irradiated with the light, and in which surface plasmons excited at one or more of the two corners interfere with each other.

According to a fourteenth aspect of the present invention, there is provided an exposure apparatus including: a light source; a projection optical system; and an optical element that is irradiated with light emitted from the light source, in which the optical element includes a hole through which the light is transmitted, and a bank which has two corners disposed near the hole, each corner surrounding the hole, and irradiated with the light, and in which surface plasmons excited at one or more of the two corners interfere with each other.

According to a fifteenth aspect of the present invention, there is provided an optical element used in an exposure apparatus, the optical element including: a hole through which light is transmitted; a surface which surrounds the hole and intersects with an axis direction of the hole; and two corners which are disposed near the hole and are connected by the surface and at which surface plasmons excited at each corner due to the irradiation of the light interfere with each other.

According to a sixteenth aspect of the present invention, there is provided an optical element used in an exposure apparatus, the optical element including: a hole through which light is transmitted; and a multilevel structure, which has two corners disposed near the hole, each corner surrounding the hole, and irradiated with the light, and in which surface plasmons excited at the two corners interfere with each other.

According to a seventeenth aspect of the present invention, there is provided an optical element used in an exposure apparatus, the optical element including: a hole through which light is transmitted; and a bank which has two corners disposed near the hole, each corner surrounding the hole, and irradiated with the light, and in which surface plasmons excited at each of the two corners interfere with each other.

According to an eighteenth aspect of the present invention, there is provided an exposure method including: measuring predetermined optical characteristics by using the optical element; and transferring a pattern image onto a substrate on the basis of a measurement result of the optical characteristics.

According to a nineteenth aspect of the present invention, there is provided a device manufacturing method including: exposing a substrate by using the exposure method; and developing the exposed substrate.

According to the aspects of the present invention, it is possible to generate desired spherical waves. Further, according to the aspects of the present invention, it is possible to prevent the performance of the measurement apparatus from being deteriorated. Furthermore, according to the aspects of the present invention, it is possible to prevent exposure failure from occurring and defective devices from being formed.

DESCRIPTION OF THE EMBODIMENTS

Hereinafter, embodiments of the present invention will be described with reference to the accompanying drawings, but the present invention is not limited to this. In the following description, an XYZ orthogonal coordinate system is set, and the positional relationship of the respective sections will be described with reference to the XYZ orthogonal coordinate system. It is assumed that a predetermined direction in a horizontal plane is an X axis direction, a direction orthogonal to the X axis direction in the horizontal plane is a Y axis direction, and a direction (that is, a vertical direction) orthogonal to each of the X axis direction and the Y axis direction is a Z axis direction. Further, it is assumed that rotation (inclination) directions about the X axis, the Y axis, and the Z axis are θX, θY, and θZ directions, respectively.

First Embodiment

Figure 1:
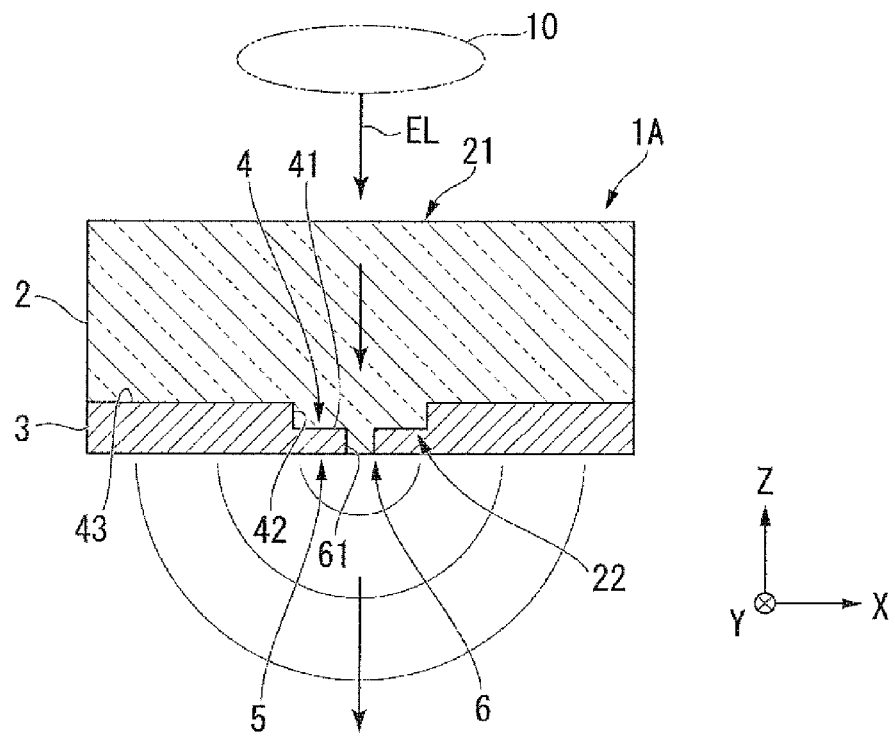
FIG. 1 is a cross-sectional side view illustrating an example of an optical element according to a first embodiment.
Figure 2:
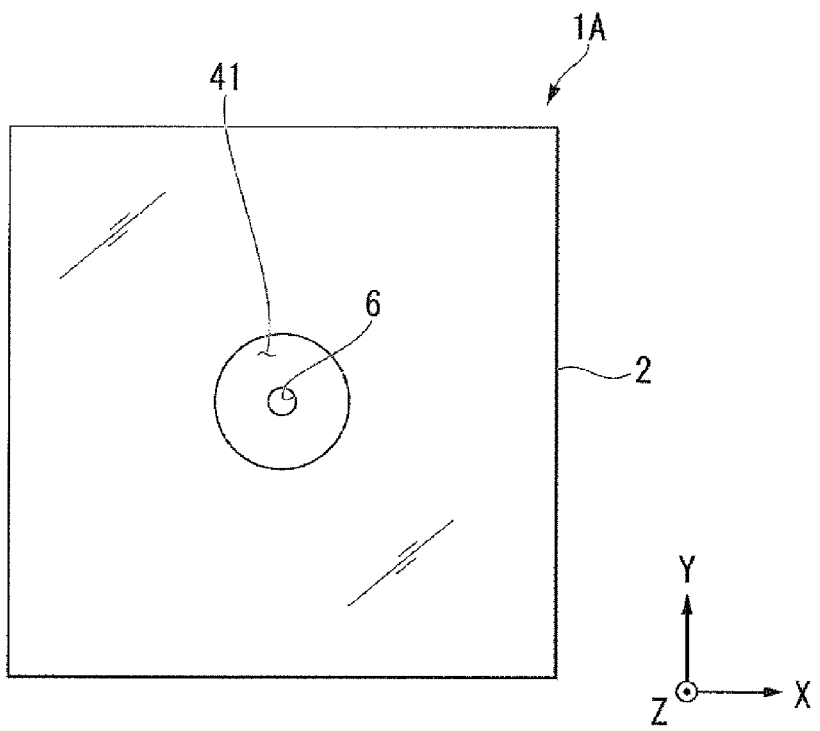
FIG. 2 is a top plan view illustrating an example of the optical element according to the first embodiment.
Figure 3:
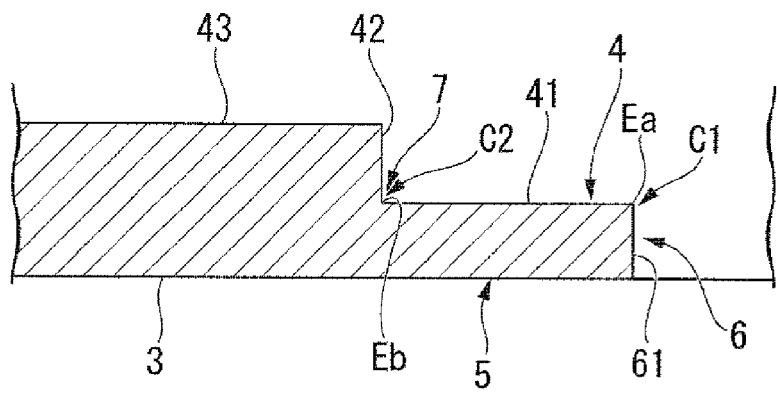
FIG. 3 is a diagram illustrating a part of the optical element according to the first embodiment in an enlarged manner.
Figure 3:
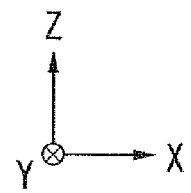

The first embodiment will be described. FIG. 1 is a cross-sectional side view illustrating an example of an optical element 1A according to the first embodiment. FIG. 2 is a top plan view of the optical element 1A as viewed from +Z side. FIG. 3 is a diagram illustrating a part of FIG. 1 in an enlarged manner.

In FIGS. 1, 2, and 3, the optical element 1A includes: a transparent member 2 that is capable of transmitting irradiation light EL; and a metal film 3 that is formed on at least a part of the surface of the transparent member 2.

In the present embodiment, the transparent member 2 is formed of, for example, silica glass. The metal film 3 is formed of, for example, gold. It should be noted that the metal film 3 may be formed of silver, may be formed of aluminum, and may be formed of a different material. Further, the metal film 3 may contain gold and a material different from gold, may contain silver and a material different from silver, and may contain aluminum and a material different from aluminum. The thickness of the metal film 3 may be, for example, in the range of 50 nm to 1000 nm. The thickness of the metal film 3 can be, for example, about 5, 10, 20, 30, 40, 50, 60, 70, 80, 90, 100, 150, 200, 250, 300, 350, 400, 450, 500, 550, 600, 650, 700, 750, 800, 850, 900, 950, 1000 nm, or more. The wavelength of the irradiation light EL is $\lambda_R$.

In the present embodiment, the surface of the transparent member 2 includes an upper surface 21 that faces the +Z direction, and a lower surface 22 of which at least a part faces an opposite direction (that is, the −Z direction) of the upper surface 21. The metal film 3 is formed on the lower surface 22. In the present embodiment, the upper surface 21 is flat. In the present embodiment, the upper surface 21 is irradiated with the irradiation light EL. At least a part of the metal film 3 is irradiated with the irradiation light EL, with which the upper surface 21 is irradiated, through the transparent member 2.

The metal film 3 has an incident surface 4 which is irradiated with the irradiation light EL, an emission surface 5 of which at least a part faces the opposite direction of the incident surface 4, and a hole (pinhole) 6 that is formed to connect the incident surface 4 and the emission surface 5.

The incident surface 4 includes a first surface 41, which is disposed around an end of the hole 6 on the incident surface 4 side and has an inner edge Ea connected to an inner surface 61 of the hole 6, and a second surface 42 which is disposed around the first surface 41 and forms a discontinuous portion 7 between the second surface 42 and an outer edge Eb of the first surface 41.

Further, in the present embodiment, the incident surface 4 includes a third surface 43 which is disposed around the second surface 42 and is substantially parallel with the first surface 41.

In the present embodiment, the inner surface 61 is substantially parallel with the Z axis. The first surface 41 is substantially parallel with the XY plane. The second surface 42 is substantially parallel with the Z axis. The third surface 41 is substantially parallel with the XY plane.

As shown in FIG. 2, in the XY plane, the shape of the hole 6 is a circle. The exterior shape of the first surface 41 is a circle. In the XY plane, the center of the hole 6 substantially coincides with the center of the first surface 41. It should be noted that the center of the hole 6 may deviate from the center of the first surface 41. Further, the exterior shape of the first surface 41 may be, for example, an ellipse, or a polygon such as a quadrangle or an octagon.

In the present embodiment, the inner edge Ea includes a corner C1 which is formed by the first surface 41 and the inner surface 61 of the hole 6. In other words, the corner C1 is formed at the inner edge Ea. In the XZ plane (in the YZ plane), an angle which is formed by the first surface 41 and the inner surface 61, is about 90 degrees. In the present embodiment, the corner C1 is sharp. It should be noted that the corner C1 may be rounded.

In the present embodiment, the second surface 42 is disposed around the first surface 41 so as to face the inner side with respect to the radial direction centered on the hole 6 (in an inward radial direction). In the present embodiment, the discontinuous portion 7 includes a corner C2 which is formed by the first surface 41 and the second surface 42. In other words, the corner C2 is formed at the outer edge Eb. The discontinuous portion 7 is formed by the corner C2. In other words, the optical element 1A has a pore wall (hole wall) having a multilevel structure. In the present embodiment, the multilevel structure is made of the metal film 3, and includes the corner C1, the first surface (axial surface) 41, the corner C2, the second surface (radial surface) 42, and the inner surface (radial surface) 61. The corner C1 and the corner C2 are connected to the same axial surface (first surface) which intersects with the axis direction of the hole 6. That is, the axial surface (first surface 41) connects the corner C1 and the corner C2. In the present embodiment, at least the first surface 41, the corner C1, and the corner C2 are directly irradiated with the irradiation light EL. As described later, the multilevel structure of the pore wall is designed depending on the wavelength of the surface plasmons. In the multilevel structure, the surface plasmons, which are excited at each of the two corners C1 and C2, interfere with each other.

As shown in FIG. 1, in the present embodiment, the optical element 1A is irradiated with the irradiation light EL through an optical system 10. In the present embodiment, the optical system 10 condenses the irradiation light EL so as to irradiate the hole 6 and the inner edge Ea with the irradiation light EL.

It should be noted that the numerical aperture of the optical system 10 may be one or more. In addition, in a state where the gap between the optical system 10 and the optical element 1A (transparent member 2) is filled with liquid (for example, immersion oil), the optical element 1A may be irradiated with the irradiation light EL from the optical system 10. In that case, the size of a region (spot light) of the optical element 1A irradiated with the irradiation light EL can be set to be equal to or less than, for example, the diffraction limit in the air.

In the present embodiment, the size (diameter) of the hole 6 may be equal to or less than twice the wavelength of the irradiation light EL with which the metal film 3 is irradiated. In addition, the wavelength $\lambda_R$ includes a wavelength of the irradiation light EL when the light passes through the transparent member 2 (optical wavelength). For example, the size of the hole 6 may be set in the range of 1/20 to 2 times the wavelength $\lambda_R$. For example, in a case of using the irradiation light EL of which the wavelength $\lambda_R$ is 633 nm, the size of the hole 6 may be set in the range of 30 nm to 1200 nm.

By irradiating the metal film 3 with the irradiation light EL, the surface plasmons are excited on the metal film 3. Generally, the surface plasmons are excited at a specific wavenumber $k_{sp}$ which is set as a unique value depending on the wavelength $\lambda_R$ of the irradiation light EL, the permittivity of the transparent member 2, and the permittivity of the metal film 3.

For example, when the wavelength $\lambda_R$ of the irradiation light EL is 633 nm, by using gold as the metal film 3, the surface plasmons are efficiently excited. Further, when the wavelength $\lambda_R$ of the irradiation light EL is in the range of 600 to 400 nm, by using silver as the metal film 3, the surface plasmons are efficiently excited. Furthermore, when the wavelength $\lambda_R$ of the irradiation light EL is in the range of 150 to 400 nm, by using aluminum as the metal film 3, the surface plasmons are efficiently excited.

In the present embodiment, when the metal film 3 is irradiated with the irradiation light EL, the surface plasmons are mostly excited at the inner edge Ea (corner C1).

Figure 4:
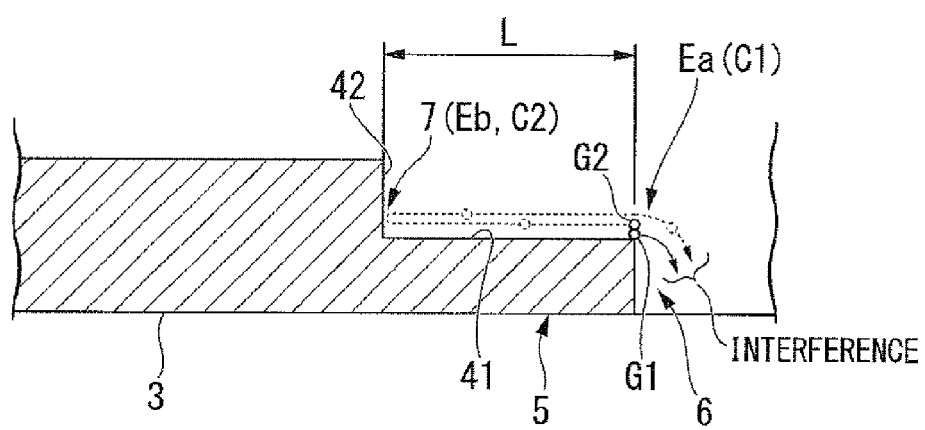
FIG. 4 is a diagram schematically illustrating an example of a surface plasmons state in the optical element according to the first embodiment.
Figure 4:
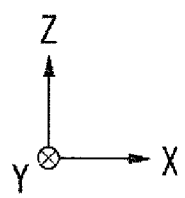

FIG. 4 is a diagram schematically illustrating the surface plasmons which are excited at the inner edge Ea (corner C1). As shown in FIG. 4, among the surface plasmons which are excited at the inner edge Ea due to the irradiation of the irradiation light EL, some surface plasmons travel toward the hole 6, and some surface plasmons travel toward the outer side with respect to the radial direction centered on the hole 6 (in an outward radial direction).

In the following description, among the surface plasmons which are excited at the inner edge Ea, the surface plasmons which travel toward the hole 6, are occasionally referred to as a first surface plasmon group G1, and the surface plasmons, which travel toward the outer side with respect to the radial direction centered on the hole 6 (in an outward radial direction), are occasionally referred to as a second surface plasmon group G2.

The second surface plasmon group G2 propagates on the first surface 41 toward the outer side with respect to the radial direction centered on the hole 6 (in an outward radial direction), and reaches the discontinuous portion 7. In the present embodiment, the discontinuous portion 7 includes a portion that blocks the propagation of the surface plasmons propagating in predetermined one direction. In the present embodiment, the discontinuous portion 7 is the outer edge Eb (corner C2). The second surface plasmon group G2, which propagates on the first surface 41 from the inner edge Ea toward the outer side with respect to the radial direction centered on the hole 6 (in an outward radial direction), is blocked from propagating to the outside at the discontinuous portion 7.

The second surface plasmon group G2, which propagates on the first surface 41 toward the outer side with respect to the radial direction centered on the hole 6 (in an outward radial direction) and reaches the discontinuous portion 7, is reflected by the discontinuous portion 7. The second surface plasmon group G2, which is reflected by the discontinuous portion 7, propagates on the first surface 41 from the discontinuous portion 7 toward the hole 6.

In the present embodiment, the distance L between the inner edge Ea and the outer edge Eb (discontinuous portion 7) is determined depending on the wavelength $\lambda_{sp}$ of the surface plasmons such that the intensity of light, which is emitted from the hole 6 to the emission surface 5 side, is increased due to interference between the first surface plasmon group G1, which is excited at the inner edge Ea due to the irradiation of the irradiation light EL and travels toward the hole 6, and the second surface plasmon group G2 which travels from the discontinuous portion 7 toward the hole 6.

In the present embodiment, assuming that the distance between the inner edge Ea and the outer edge Eb is L and the wavelength of the surface plasmons is $\lambda_{sp}$, the following condition is satisfied:

$$L = m \cdot \lambda_{sp}/2 \ (m \text{ is a positive odd number}) \quad (1).$$

Here, the distance L is a distance with respect to a direction of propagation of the second surface plasmon group G2. In addition, in the present embodiment, the distance L is a distance with respect to the radial direction centered on the hole 6.

Thereby, the first surface plasmon group G1 interferes with the second surface plasmon group G2, and thus the intensity of the light (spherical waves), which is emitted from the hole 6 to the emission surface 5 side, is increased.

In addition, assuming that the wavenumber in a vacuum is $k_0$, the complex permittivity of the metal film is $\in_m$, and the complex permittivity of the transparent member is $\in_d$, the wavenumber (propagation constant) $k_{sp}$ of the surface plasmons, which propagate through the interface between the metal film 3 and the transparent member 2 (dielectric material), is represented by $$k_{sp} = k_0 [\in_m \cdot \in_d / (\in_m + \in_d)]^{1/2} \quad (2).$$

Further, the wavelength $\lambda_{sp}$ of the surface plasmons is represented by $$\lambda_{sp} = 2\pi/k_{sp} \quad (3).$$

In addition, when the condition of Expression (1) is satisfied, the value of L may be excessively large. In this case, loss of the surface plasmons (second surface plasmon group G2), which propagate on the first surface 41, increases. Thus, the value of L may be set to be equal to or less than twice $\lambda_{sp}$. For example, in Expression (1), the value of m may be 1 or 3.

For example, the surface plasmons, which propagate through the interface between the transparent member 2 (silica glass) and the metal film 3, are theoretically obtained from the respective permittivities of the transparent member 2 and the metal film 3. The wavelength $\lambda_{sp}$ of the surface plasmons is, for example, about 380 nm. In order to reflect the surface plasmons which propagate through the interface between the transparent member 2 and the metal film 3, the distance L between the inner edge Ea and the outer edge Eb may be, for example, half of the wavelength $\lambda_{sp}$ (that is, about 190 nm). In this case, the phase of the first surface plasmon group G1, which is excited at the inner edge Ea and travels toward the hole 6, matches the phase of the second surface plasmon group G2 which travels from the discontinuous portion 7 toward the hole 6. Thereby, the efficiency of the incidence of the surface plasmons to the hole 6 is maximized, and the intensity of the light, which is emitted from the hole 6, increases.

Each of the first surface plasmon group G1 and the second surface plasmon group G2 propagates to the inside of the hole 6, reaches the end of the hole 6 on the emission surface 5 side, and is then converted again into spatial propagation light and emitted from the hole 6. Thereby, the light (quasi point light source), of which the energy is increased, can be obtained.

More specifically, for example, it is assumed that the material of the transparent member 2 is silica glass ($\in_d = 2.434$), the material of the metal film 3 is aluminum ($\in_m = -4.711$), and the irradiation light EL with a wavelength of 193 nm is emitted. In this case, the wavenumber in a vacuum $k_0$ is represented by $2\pi/\lambda_0 = 0.03256$ nm$^{-1}$, and the wavenumber $k_{sp}$ of the surface plasmons is calculated as 0.07306 nm$^{-1}$ from Expression (2). Then, when the calculated $k_{sp}$ is substituted into Expression (3), the wavelength $\lambda_{sp}$ of the surface plasmons is calculated as 86 nm. Accordingly, under such a condition, from Expression (1), the distance L between the inner edge Ea and the outer edge Eb can be set as a positive odd multiple of 43 nm.

In addition, the height (the size in the Z axis direction) of the second surface 42 may be low (for example, about 10 nm or less). In this case, there is a possibility that the second surface plasmon group G2, which is excited at the inner edge Ea and propagates toward the discontinuous portion 7, is not sufficiently reflected on the discontinuous portion 7 (second surface 42). In contrast, the height of the second surface 42 may be high (for example, about 500 nm or more). In this case, the second surface plasmon group G2, which is reflected on the discontinuous portion 7 (second surface 42), suffers a loss during propagation to the hole 6. As a result, there is a possibility that the energy of the second surface plasmon group G2 reaching the hole 6 decreases. Hence, the height of the second surface 42 may be appropriately adjusted such that the intensity of the light, which is emitted from the hole 6, is not low.

As described above, according to the present embodiment, the distance L between the inner edge Ea and the outer edge Eb is determined depending on the wavelength $\lambda_{sp}$ of the surface plasmons such that the intensity of the light, which is emitted from the hole 6 to the emission surface 5 side, is increased due to the interference between the first surface plasmon group G1 and the second surface plasmon group G2. Therefore, even when the size (diameter) of the hole 6 is set to be small, light (spherical waves) with a desired intensity can be emitted to the emission surface 5 side. Further, by decreasing the size (diameter) of the hole 6, spherical waves can be suitably formed.

Second Embodiment

Next, a second embodiment will be described. In the following description, the components, which are the same as or equivalent to those of the above-mentioned embodiment, are represented by the same references and numerals, and a description thereof will be simplified or omitted here.

Figure 5:
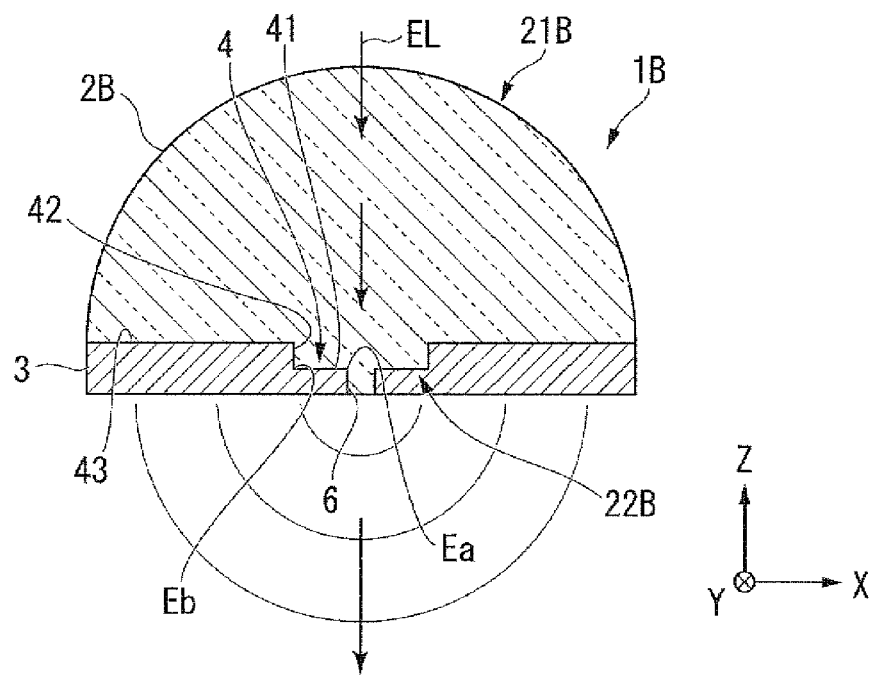
FIG. 5 is a cross-sectional side view illustrating an example of an optical element according to a second embodiment.
Figure 6:
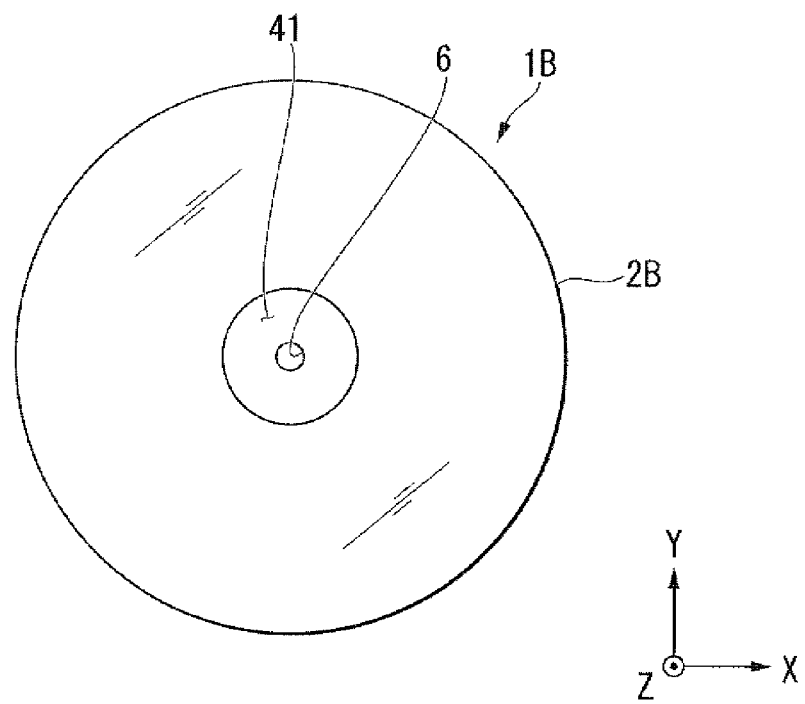
FIG. 6 is a top plan view illustrating an example of the optical element according to the second embodiment.

FIG. 5 is a cross-sectional side view illustrating an example of an optical element 1B according to the second embodiment. FIG. 6 is a top plan view of the optical element 1B as viewed from the +Z side.

In the present embodiment, the transparent member 2B is a solid immersion lens. An upper surface (incident surface) 21B of the transparent member 2B irradiated with the irradiation light EL is a curved surface. The solid immersion lens is a hemispherical lens, and is formed of, for example, a high refractive index material such as high refractive index glass and artificial diamond.

In the present embodiment, a lower surface 22B of the transparent member (solid immersion lens) 2B, on which the metal film 3 is formed, is in the focal plane of the solid immersion lens 2B. Thereby, the hole 6 of the metal film 3 and the inner edge Ea are suitably irradiated with the irradiation light EL, which is incident onto the upper surface 21B of the solid immersion lens 2B, through the solid immersion lens 2B.

Third Embodiment

Next, a third embodiment will be described. In the following description, the components, which are the same as or equivalent to those of the above-mentioned embodiment, are represented by the same references and numerals, and a description thereof will be simplified or omitted here.

Figure 7:
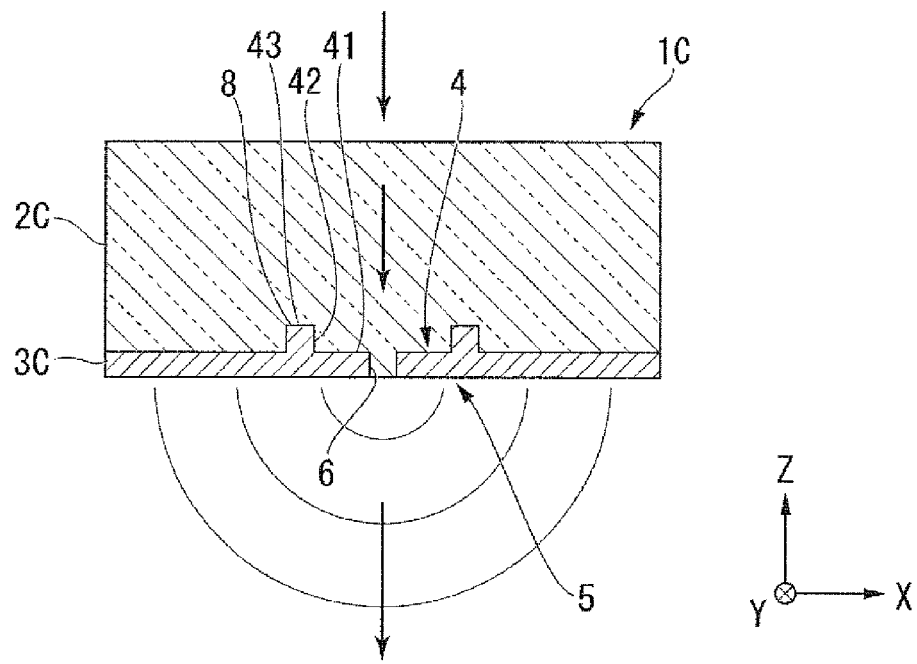
FIG. 7 is a cross-sectional side view illustrating an example of an optical element according to a third embodiment.
Figure 8:
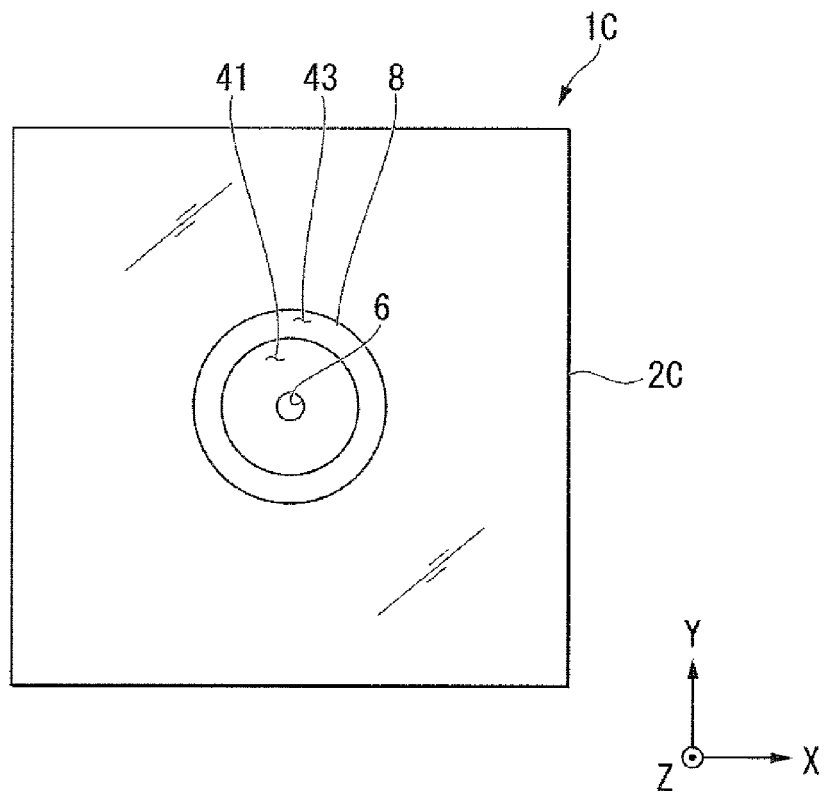
FIG. 8 is a top plan view illustrating an example of the optical element according to the third embodiment.

FIG. 7 is a cross-sectional side view illustrating an example of an optical element 1C according to the third embodiment. FIG. 8 is a top plan view of the optical element 1C as viewed from the +Z side.

In the present embodiment, a metal film 3C has a circumferential wall portion (bank) 8 which is disposed around the hole 6. In the present embodiment, the second surface 42 is an inner surface of the circumferential wall portion 8. The third surface 43 is an upper surface of the circumferential wall portion 8. Even in the present embodiment, it is possible to increase the intensity of the light which is emitted from the hole 6 to the emission surface 5 side. In other words, the optical element 1C has a pore wall (hole wall) having a multilevel structure. In the present embodiment, the multilevel structure is made of the metal film 3C, and includes a first corner (corner), the first surface (axial surface) 41, a second corner (corner), the second surface (radial surface) 42, the third surface (axial surface) 43, and an inner surface (radial surface) 6. The first corner is arranged between the first surface 41 and the inner surface 6. The second corner is arranged between the first surface 41 and the second surface 42. The first corner and the second corner are connected to the same axial surface (first surface 41) which intersects with the axis direction of the hole 6. That is, the axial surface (first surface 41) connects the first corner and the second corner. In the present embodiment, at least the first surface 41, the first corner, and the second corner are directly irradiated with the irradiation light EL. The multilevel structure of the pore wall is also designed depending on the wavelength of the surface plasmons. In the multilevel structure, the surface plasmons, which are excited at the one or more of the two corners, interfere with each other.

It should be noted that, in the present embodiment, the width (the distance between the inner surface and the outer surface of the circumferential wall portion 8) of the circumferential wall portion 8 may be set in the range of 1/20 to 1 times the wavelength $\lambda_R$. For example, when the wavelength $\lambda_R$ is 633 nm, the width of the circumferential wall portion 8 may be set to about 200 nm.

Fourth Embodiment

Next, a fourth embodiment will be described. In the following description, the components, which are the same as or equivalent to those of the above-mentioned embodiment, are represented by the same references and numerals, and a description thereof will be simplified or omitted here.

Figure 9:
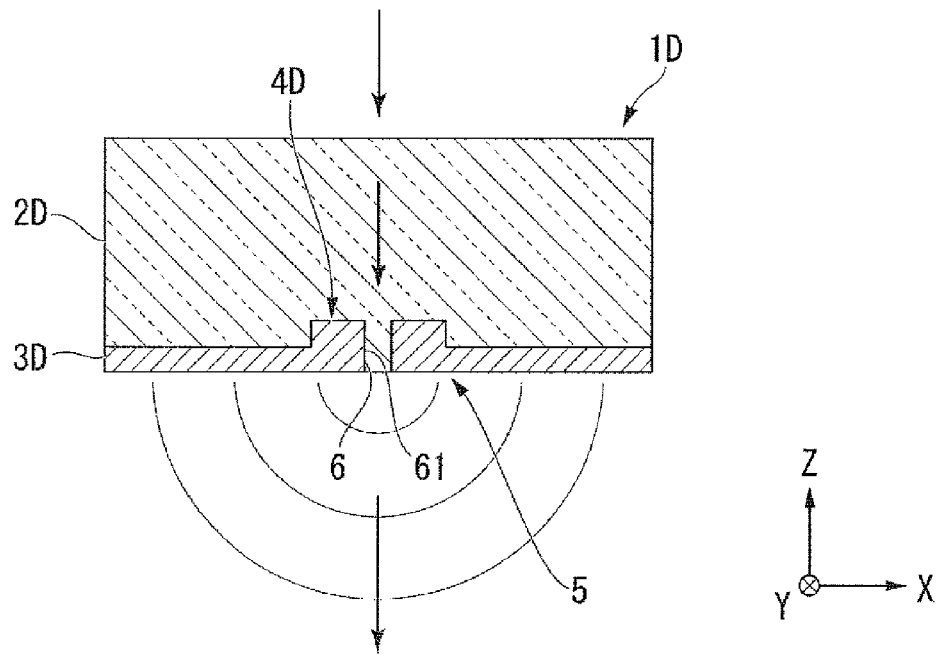
FIG. 9 is a cross-sectional side view illustrating an example of an optical element according to a fourth embodiment.
Figure 10:
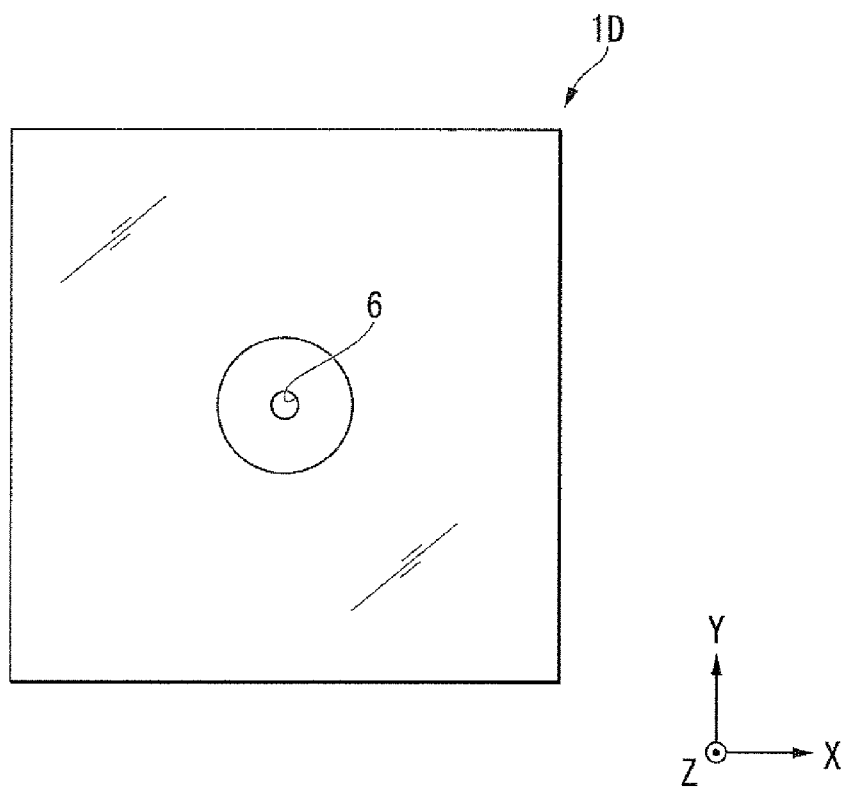
FIG. 10 is a top plan view illustrating an example of the optical element according to the fourth embodiment.
Figure 11:
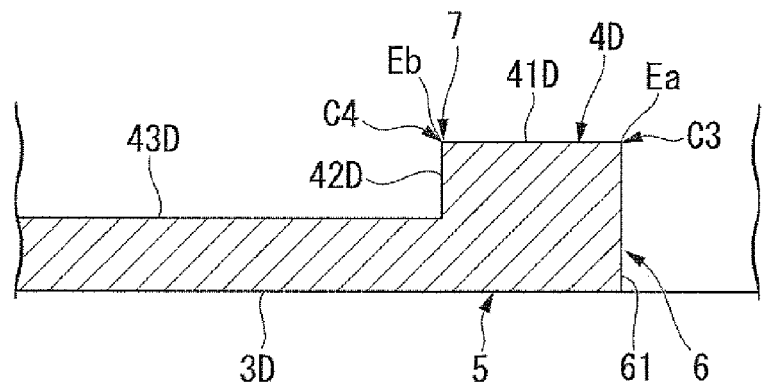
FIG. 11 is a diagram illustrating a part of the optical element according to the fourth embodiment in an, enlarged manner.
Figure 11:
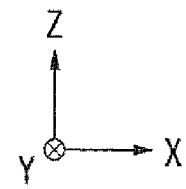

FIG. 9 is a cross-sectional side view illustrating an example of an optical element 1D according to the fourth embodiment. FIG. 10 is a top plan view of the optical element 1D as viewed from the +Z side. FIG. 11 is a diagram illustrating a part of FIG. 9 in an enlarged manner.

In FIGS. 9, 10, and 11, the optical element 1D includes: a transparent member 2D that is capable of transmitting irradiation light EL; and a metal film 3D that is formed on at least a part of the surface of the transparent member 2D.

The metal film 3D has an incident surface 4D which is irradiated with the irradiation light EL, an emission surface 5 of which at least a part faces the opposite direction of the incident surface 4D, and a hole (pinhole) 6 that is formed to connect the incident surface 4D and the emission surface 5.

The incident surface 4D includes a first surface 41D, which is disposed around an end of the hole 6 on the incident surface 4D side and has an inner edge Ea connected to an inner surface 61 of the hole 6, and a second surface 42D which is disposed around the first surface 41D and forms a discontinuous portion 7 between the second surface 42D and an outer edge Eb of the first surface 41D.

Further, in the present embodiment, the incident surface 4D includes a third surface 43D which is disposed around the second surface 42D and is substantially parallel with the first surface 41D.

In the present embodiment, the inner edge Ea includes a corner C3 which is formed by the first surface 41D and the inner surface 61 of the hole 6. In other words, the corner C3 is formed at the inner edge Ea. In the XZ plane (in the YZ plane), an angle, which is formed by the first surface 41D and the inner surface 61, is about 90 degrees. In the present embodiment, the corner C3 is sharp. It should be noted that the corner C3 may be rounded.

In the present embodiment, the second surface 42D is disposed around the first surface 41D so as to face the outer side with respect to the radial direction centered on the hole 6 (in an outward radial direction). In the present embodiment, the discontinuous portion 7 includes a corner C4 which is formed by the first surface 41D and the second surface 42D. In other words, the corner C4 is formed at the outer edge Eb. The discontinuous portion 7 is formed by the corner C4. In other words, the optical element 1D has a pore wall (hole wall) having a multilevel structure. In the present embodiment, the multilevel structure (bank) is made of the metal film 3D, and includes the corner (corner) C3, the first surface (axial surface) 41D, the corner (corner) C4, the second surface (radial surface) 42D, and the inner surface (radial surface) 61. The corner C3 is arranged between the first surface 41D and the inner surface 61. The corner C4 is arranged between the first surface 41D and the second surface 42D. The corner C3 and the corner C4 are connected to the same axial, surface (first surface 41D) which intersects with the axis direction of the hole 6. That is, the axial surface (first surface 41D) connects the corner C3 and the corner C4. In the present embodiment, at least the first surface 41D, the corner C3, and the corner C4 are directly irradiated with the irradiation light EL. The multilevel structure (bank) of the pore wall is also designed depending on the wavelength of the surface plasmons. In the multilevel structure (bank), the surface plasmons, which are excited at one or two of the two corners C3 and C4, interfere with each other.

By irradiating the metal film 3D with the irradiation light EL, the surface plasmons are excited on the metal film 3D.

In the present embodiment, when the metal film 3D is irradiated with the irradiation light EL, the surface plasmons are mostly excited at the inner edge Ea (corner C3).

Further, in the present embodiment, when the metal film 3D is irradiated with the irradiation light EL, the surface plasmons are also excited at the discontinuous portion 7 (corner C4) between the outer edge Eb of the first surface 41D and the second surface 42D.

Figure 12:
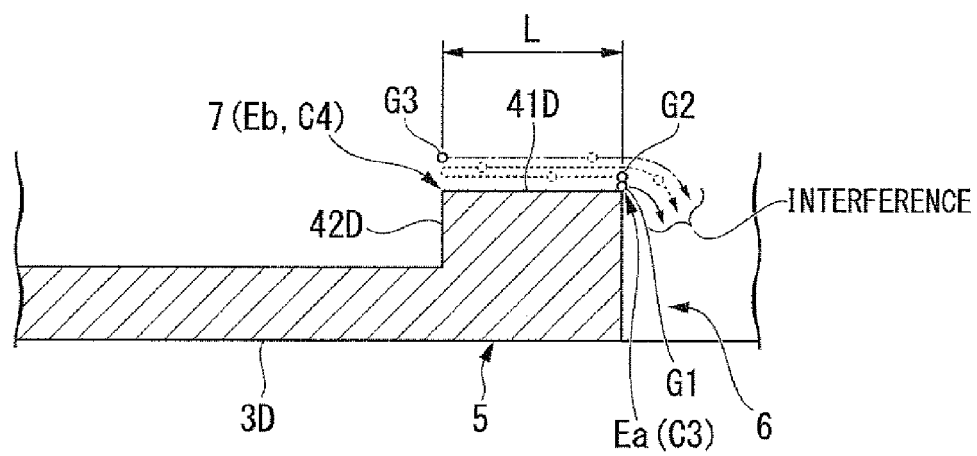
FIG. 12 is a diagram schematically illustrating an example of a surface plasmons state in the optical element according to the fourth embodiment.
Figure 12:
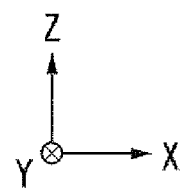

FIG. 12 is a diagram schematically illustrating the surface plasmons which are excited at the inner edge Ea (corner C3). As shown in FIG. 12, the surface plasmons, which are excited at the inner edge Ea due to the irradiation of the irradiation light EL, include: the first surface plasmon group G1 which travels toward the hole 6; and a second surface plasmon group G2 which travels toward the outer side with respect to the radial direction centered on the hole 6 (in an outward radial direction).

The second surface plasmon group G2 propagates on the first surface 41D toward the outer side with respect to the radial direction centered on the hole 6 (in an outward radial direction), and reaches the discontinuous portion 7. In the present embodiment, the discontinuous portion 7 is the outer edge Eb (corner C4). The second surface plasmon group G2, which propagates on the first surface 41D from the inner edge Ea toward the outer side with respect to the radial direction centered on the hole 6 (in an outward radial direction), is blocked from propagating to the outside at the discontinuous portion 7.

The second surface plasmon group G2, which propagates on the first surface 41D toward the outer side with respect to the radial direction centered on the hole 6 (in an outward radial direction) and reaches the discontinuous portion 7, is reflected by the discontinuous portion 7. The second surface plasmon group G2, which is reflected by the discontinuous portion 7, propagates on the first surface 41D from the discontinuous portion 7 toward the hole 6.

Further, in the present embodiment, at least some of the surface plasmons, which are excited at the discontinuous portion 7 between the outer edge Eb of the first surface 41D and the second surface 42D, propagate on the first surface 41D from the discontinuous portion 7 toward the hole 6.

In the following description, the surface plasmons, which are excited at the discontinuous portion 7 (outer edge Eb) due to the irradiation of the irradiation light EL and travel from the discontinuous portion 7 toward the hole 6, are occasionally referred to as a third surface plasmon group G3.

In the present embodiment, the distance L between the inner edge Ea and the outer edge Eb (discontinuous portion 7) is determined depending on the wavelength $\lambda_{sp}$ of the surface plasmons such that the intensity of light, which is emitted from the hole 6 to the emission surface 5 side, is increased due to interference between the first surface plasmon group G1, which is excited at the inner edge Ea due to the irradiation of the irradiation light EL and travels toward the hole 6, and the second surface plasmon group G2 which travels from the discontinuous portion 7 toward the hole 6.

Further, in the present embodiment, the distance L between the inner edge Ea and the outer edge Eb (discontinuous portion 7) is determined depending on the wavelength $\lambda_{sp}$ of the surface plasmons such that the intensity of light, which is emitted from the hole 6 to the emission surface 5 side, is increased due to interference between the first surface plasmon group G1, which is excited at the inner edge Ea due to the irradiation of the irradiation light EL and travels toward the hole 6, and the third surface plasmon group G3 which travels from the discontinuous portion 7 toward the hole 6.

In the present embodiment, assuming that the distance between the inner edge Ea and the outer edge Eb is L and the wavelength of the surface plasmons is $\lambda_{sp}$, the following condition is satisfied:

$$L = m \cdot \lambda_{sp}/2 \text{ (} m \text{ is a positive even number)} \qquad (4).$$

Thereby, the first surface plasmon group G1 interferes with the second surface plasmon group G2, and thus the intensity of the light (spherical waves), which is emitted from the hole 6 to the emission surface 5 side, is increased. Further, the first surface plasmon group G1 interferes with the third surface plasmon group G3, and thus the intensity of the light which is emitted from the hole 6 to the emission surface 5 side (spherical waves), is increased.

Specifically, when the material of the transparent member 2 is silica glass, the material of the metal film 3 is aluminum, and the irradiation light EL with a wavelength of 193 nm is emitted, the wavelength $\lambda_{sp}$ of the surface plasmons is calculated as 86 nm from Expressions (2) and (3). Accordingly, under such a condition, from Expression (4), the distance L between the inner edge Ea and the outer edge Eb can be set as a positive even multiple of 43 nm.

Fifth Embodiment

Next, a fifth embodiment will be described. Hereinafter, results of tests for checking the effects of the above-mentioned optical element 1A will be described.

When the optical element 1A described in the above-mentioned first embodiment is irradiated with the irradiation light EL of which the wavelength is 633 nm, the intensity of the light, which is emitted from the hole 6, is calculated from a simulation and a practical test.

Figure 13:
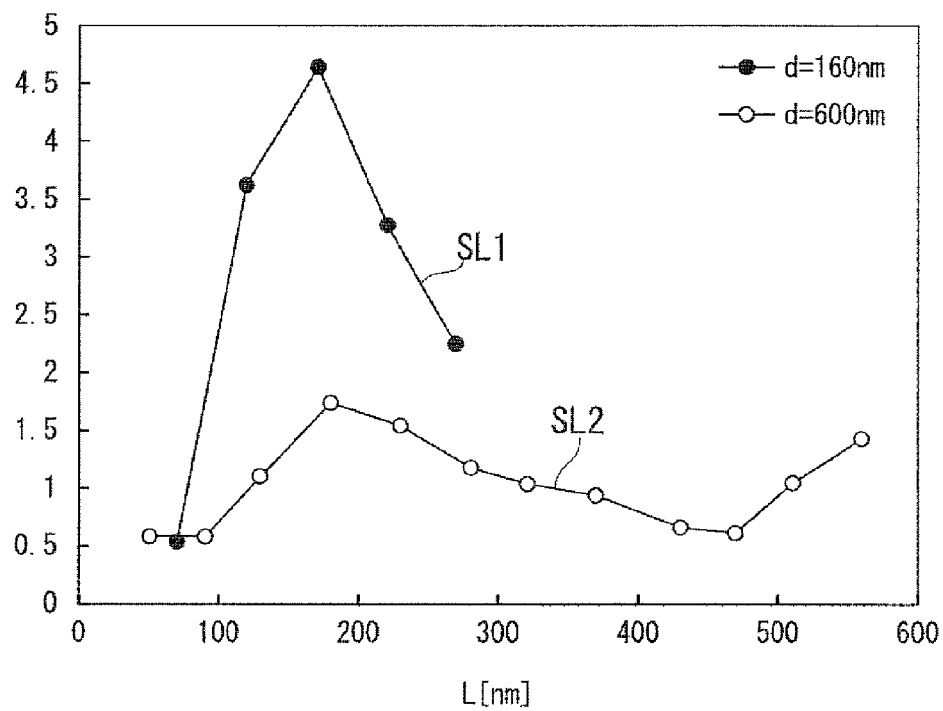
FIG. 13 is a diagram illustrating an example of test results according to a fifth embodiment.

FIG. 13 is a diagram illustrating results of simulations. The simulation condition is that the thickness of the metal film 3 (the distance between the first surface 41 and the emission surface 5) was set to 300 nm. Further, in each of cases where the size (diameter) of the hole 6 is 160 nm and 600 nm, the intensity of the light, which is emitted from the hole 6, was calculated.

In FIG. 13, the vertical axis indicates a value which is obtained by normalizing the intensity of the light emitted from the hole 6 by the intensity of the light emitted from the hole of the metal film in which there is no discontinuous portion (the incident surface is planar). The horizontal axis indicates the distance L between the inner edge Ea and the outer edge Eb. Further, in FIG. 13, the line SL1 indicates the case where the size of the hole 6 is 160 nm, and the line SL2 indicates the case where the size of the hole 6 is 600 nm. Further, the wavelength $\lambda_{sp}$ of the surface plasmons, which propagate through the interface between the transparent member 2 and the metal film 3, is theoretically calculated from respective permittivities of the transparent member 2 and the metal film 3, and is about 380 am, in the present test.

As shown in FIG. 13, when the distance L is about 180 nm or about 560 nm, the intensity of the light, which is emitted from the hole 6, increases. As described above, the wavelength $\lambda_{sp}$ of the surface plasmons is about 380 nm, and thus the values of the distance L correspond to a case of m=1 and a case of m=3, in the above-mentioned Expression (1). As described above, by manufacturing the optical element 1A such that the condition of Expression (1) is satisfied, it is known that the intensity of the light, which is emitted from the hole 6, can be increased.

Figure 14:
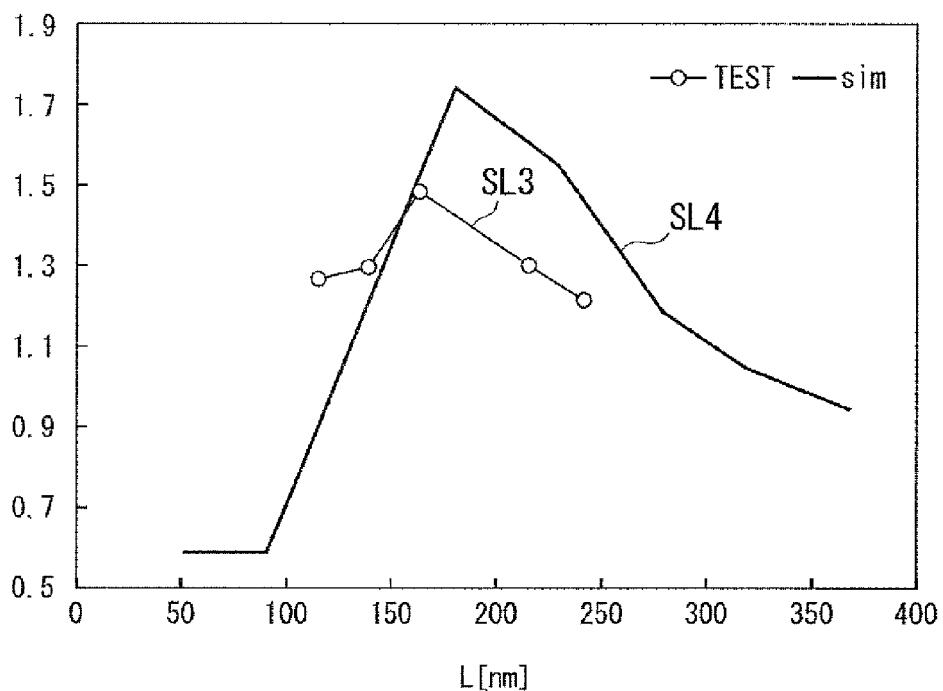
FIG. 14 is a diagram illustrating an example of test results according to the fifth embodiment.

FIG. 14 is a diagram illustrating results of practical tests. The optical element 1A, of which the thickness of the metal film 3 (the distance between the first surface 41 and the emission surface 5) is 300 nm and of which the size (diameter) of the hole 6 is 460 nm, was formed. Then, the optical element 1A was irradiated with the irradiation light EL of which the wavelength $\lambda_R$ is 633 nm. At this time, the intensity of the light, which is emitted from the hole 6, was measured. Further, under the same condition, simulations were performed.

In FIG. 14, the vertical axis indicates a value which is obtained by normalizing the intensity of the light emitted from the hole 6 by the intensity of the light emitted from the hole of the metal film in which there is no discontinuous portion (the incident surface is planar). The horizontal axis indicates the distance L between the inner edge Ea and the outer edge Eb. In FIG. 14, the line SL3 is a result of the practical test. The line SL4 is a result of a simulation. The wavelength $\lambda_{sp}$) of the surface plasmons is about 380 nm.

As shown in FIG. 14, when the distance L is about 170 nm, the intensity of the light, which is emitted from the hole 6, increases. As described above, the wavelength $\lambda_{sp}$ of the surface plasmons is about 380 nm, and thus the value of the distance L corresponds to a case of m=1, in the above-mentioned Expression (1). As described above, by manufacturing the optical element 1A such that the condition of Expression (1) is satisfied, it is known that the intensity of the light, which is emitted from the hole 6, can be increased.

It should be noted that, in the above-mentioned first to fifth embodiments, the metal film 3 is disposed on at least a part of the surface of the transparent member 2, but the transparent member 2 may be removed in the optical elements 1A to 1C.

Sixth Embodiment

Next, a sixth embodiment will be described. In the following description, the components, which are the same as or equivalent to those of the above-mentioned embodiment, are represented by the same references and numerals, and a description thereof will be simplified or omitted here.

Figure 15:
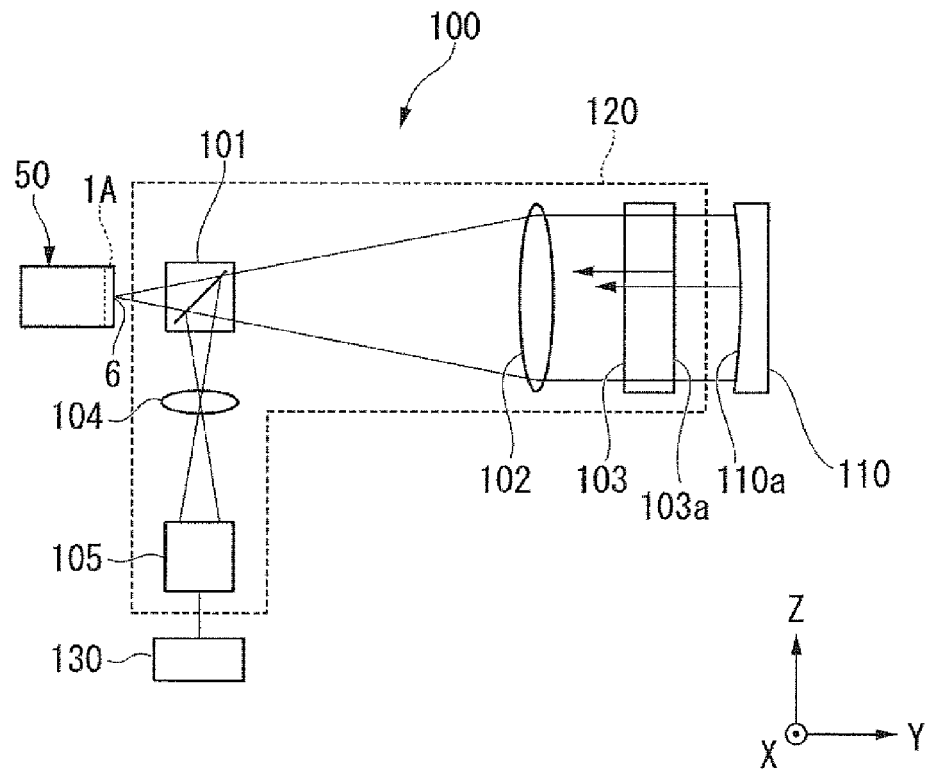
FIG. 15 is a diagram illustrating an example of a measurement apparatus according to a sixth embodiment.
Figure 16:
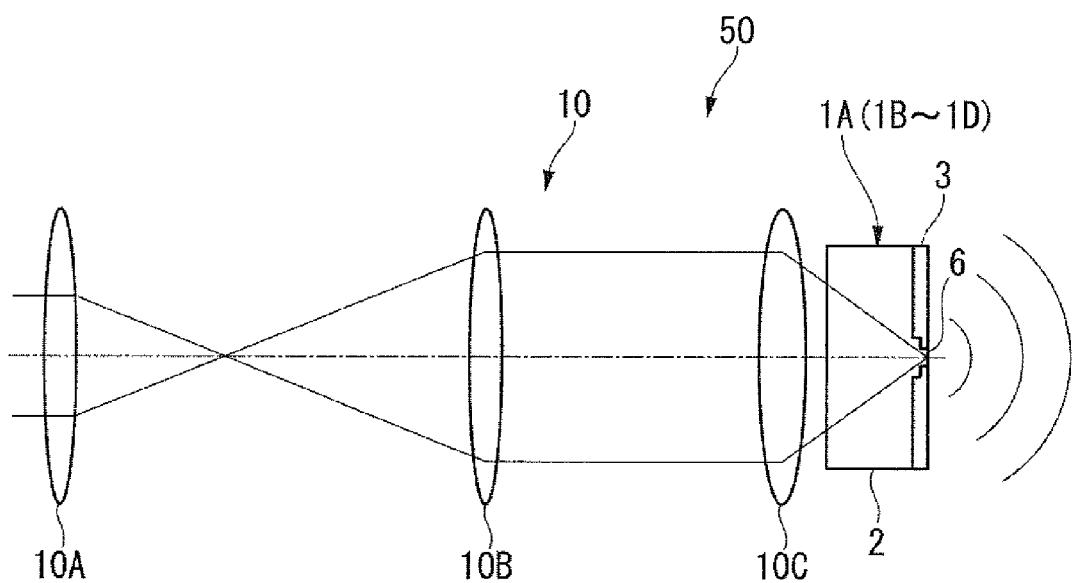
FIG. 16 is a diagram illustrating an example of an illumination device according to the sixth embodiment.

FIG. 15 is a diagram illustrating an example of a measurement apparatus 100 according to the sixth embodiment. FIG. 16 is a diagram illustrating an example of an illumination device 50 which is provided with the measurement apparatus 100.

The measurement apparatus 100 according to the present embodiment is an apparatus for measuring a wavefront aberration (wavefront aberration measurement apparatus). In the present embodiment, as an example, a case where the measurement apparatus 100 is a Fizeau interferometer will be described.

In FIG. 15, the measurement apparatus 100 includes: the illumination device 50 that has the optical element 1A and is capable of illuminating an object 110 with the light which is emitted from the hole 6 of the optical element 1A (spherical waves); a detection device 120 that detects reflected light of the light which is emitted from the hole 6 of the illumination device 50 (spherical waves) and with which a surface 110a of the object 110 is irradiated; and an arithmetic device 130 that calculates the wavefront aberration of the surface (measurement surface) 110a of the object 110 on the basis of the detection result of the detection device 120. The optical element 1A functions as a quasi point light source.

The detection device 120 has a beam splitter 101, a collimator lens 102, a base plate 103, a relay lens 104, and an imaging element 105. The object 110 is disposed to face the base plate 103. In the present embodiment, the collimator lens 102, the base plate 103, and the relay lens 104 are formed of materials such as synthetic silica glass and fluorite (calcium fluoride).

In the present embodiment, the base plate 103 is a planar glass plate polished with high accuracy. The base plate 103 has a reference surface 103a. The object 110 is disposed such that the surface 110a faces the reference surface 103a. The reference surface 103a faces the measurement surface 110a with a gap (air space) interposed therebetween.

The beam splitter 101 is able to transmit light (spherical waves) emitted from the illumination device 50. In the present embodiment, the spherical waves emitted from the illumination device 50 are transmitted through the beam splitter 101 and the collimator lens 102, and then becomes parallel light.

The surface 110a of the object 110 is irradiated with a part of the light, which is emitted from the illumination device 50 and is transmitted through the beam splitter 101, through the collimator lens 102 and the base plate 103. Then, the light is reflected by the surface 110a. The reflected light of the light with which the surface 110a of the object 110 is irradiated, is incident into the beam splitter 101, through the base plate 103 and the collimator lens 102.

Further, the reference surface 103a of the base plate 103 is irradiated with a part of the light, which is emitted from the illumination device 50 and is transmitted through the beam splitter 101, through the collimator lens 102. Then, the light is reflected by the reference surface 103a. The reflected light of the light with which the reference surface 103a of the base plate 103 is irradiated, is incident into the beam splitter 101, through the collimator lens 102.

Hereinafter, in the light which is emitted from the illumination device 50 and is transmitted through the beam splitter 101 and the collimator lens 102, the light reflected by the reference surface 103a is occasionally referred to as reference light, and the light reflected by the surface (measurement surface) 110a is occasionally referred to as measurement light.

In the present embodiment, the reference surface 103a is light splitting (amplitude splitting) means, and superimposing means. The reference surface 103a has a high surface accuracy at which the surface has only an unevenness corresponding to, for example, 1/20 or less (30 nm or less) of the wavelength of the light.

The light reflected from the reference surface 103a (reference light) and the light reflected from the surface 110a (measurement light) are incident into the beam splitter 101. The reference light interferes with the measurement light in the beam splitter 101. The light which is reflected by the beam splitter 101 (the interference light between the reference light and the measurement light) is supplied to the relay lens 104. The relay lens 104 guides the light which is emitted from the beam splitter 101 (the interference light between the reference light and the measurement light) to the imaging element 105.

The imaging element 105 is able to detect the interference light. The imaging element 105 includes a photoelectric conversion element such as, for example, a two-dimensional CCD. The imaging element 105 is able to obtain an interference fringe image.

The detection data, which includes the interference fringe image detected by the imaging element 105, is output to the arithmetic device 130. The arithmetic device 130 calculates the wavefront aberration (the shape of the measurement surface 110a), on the basis of the detection result (the detection data including the interference fringe image) which is output from the detection device 120. Further, the arithmetic device 130 displays the detection result (the detection data including the interference fringe image), which is output from the detection device 120, on a monitor not shown in the drawing. Furthermore, the arithmetic device 130 analyzes the detection result which is output from the detection device 120, numerically calculates the wavefront aberration which occurs in the surface 110a, and displays a numerical value relating to the wavefront aberration on the monitor.

In the Fizeau interferometer, the reference surface 103a faces the measurement surface 110a with a gap (air space) interposed therebetween. The optical path (in the drawing, the optical path on the −Y side) closer to the illumination device 50 than the reference surface 103a is common, and the difference between the reference surface 103a and the measurement surface 110a causes interference fringes. That is, the reference surface 103a is a highly accurate flat surface, and therefore the difference between the reference surface 103a and the measurement surface 110a is actually formed as the shape of the measurement surface 110a. In addition, there is a large optical path difference relative to the wavelength of the light between the light reflected from the reference surface 103a (reference light) and the light reflected from the measurement surface 110a (measurement light). Hence, it is necessary to use laser light with excellent coherence.

As shown in FIG. 16, the illumination device 50 includes the optical element 1A, and the optical system 10 that irradiates the optical element 1A with the irradiation light EL. The optical element 1A is the optical element 1A which is described in the above-mentioned first embodiment. It should be noted that the optical element 1A may be any one of the optical elements 1B to 1D described in the above-mentioned second to fourth embodiments.

The optical system 10 includes: a first lens 10A that condenses the light which is emitted from the light source; a second lens 10B that converts the light, which is emitted from the first lens 10A, into parallel light; and a third lens 10C that is disposed at a position, at which it faces the optical element 1A (transparent member 2), and guides the light, which is emitted from the second lens 10B, to the optical element 1A.

Seventh Embodiment

Next, a seventh embodiment will be described. In the following description, the components, which are the same as or equivalent to those of the above-mentioned embodiment, are represented by the same references and numerals, and a description thereof will be simplified or omitted here.

Figure 17:
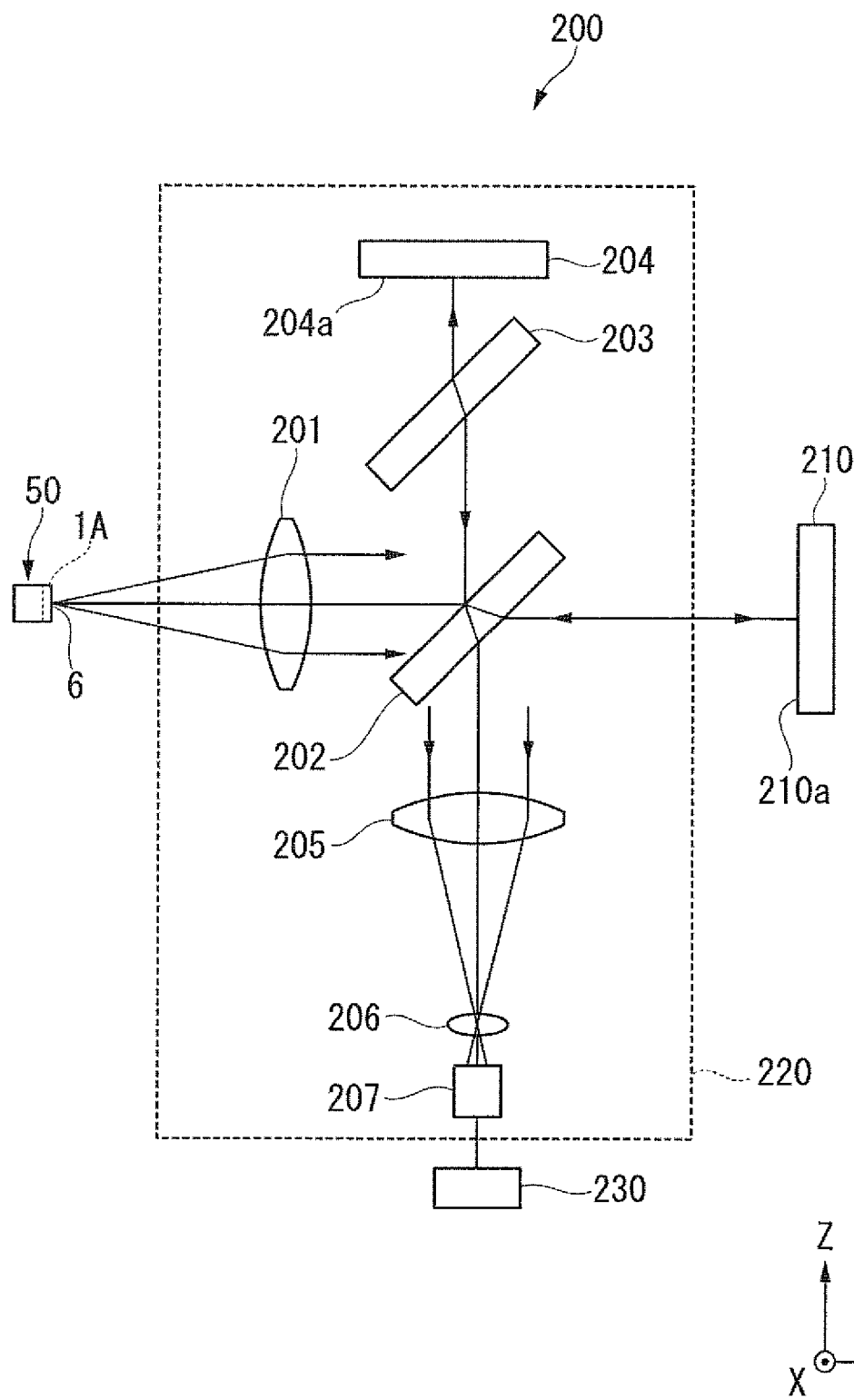
FIG. 17 is a diagram illustrating an example of a measurement apparatus according to a seventh embodiment.

FIG. 17 is a diagram illustrating an example of a measurement apparatus 200 according to the seventh embodiment. The measurement apparatus 200 includes the illumination device 50 described with reference to FIG. 16.

The measurement apparatus 200 according to the present embodiment is an apparatus for measuring a wavefront aberration (wavefront aberration measurement apparatus). In the present embodiment, as an example, a case where the measurement apparatus 200 is a Michelson interferometer will be described.

In FIG. 17, the measurement apparatus 200 includes: the illumination device 50 that has the optical element 1A (1B to 1D); a detection device 220 that detects measurement light which is emitted from the illumination device 50 and passes through an object 210; and an arithmetic device 230 that calculates the wavefront aberration of a surface (measurement surface) 210a of the object 210 on the basis of the detection result of the detection device 220.

The detection device 220 has a collimator lens 201, a half mirror 202, a correcting plate 203, a reference mirror 204, a condensing lens 205, a relay lens 206, and an imaging element 207. Further, the object 210, which has the surface (measurement surface) 210a as a target for measuring the wavefront aberration, is disposed on the +Y side onto which the light is emitted from the half mirror 202.

Spherical waves, which originate from the illumination device 50 and propagate in the +Y direction, are converted into parallel light by the collimator lens 201, and are split into two optical paths by the half mirror 202. The light beam, which propagates in the +Z direction, among two split light beams, arrives at and is reflected on the reference surface 204a of the reference mirror 204 having a surface polished with high accuracy after being transmitted through the correcting plate 203. In contrast, the light beam, which propagates in the +Y direction, among the two split light beams arrives at and is reflected on the detection target surface 210a of the object 210. Such light beams turn back along the original optical paths, are superimposed by the half mirror 202, and are guided into the imaging element 207 through the condensing lens 205 and the relay lens 206, whereby it is possible to obtain an interference fringe image. From the interference fringe image, the wavefront aberration (the shape of the detection target surface 210a) is calculated.

The collimator lens 201, the correcting plate 203, the condensing lens 205, and the relay lens 206, which are disposed in the measurement apparatus 200, are formed of a material such as synthetic silica glass or fluorite (calcium fluoride).

The imaging element 207 is to detect the interference light, and may employ a TV camera. The detection data, which includes the interference fringe image detected by the imaging element 207, is output to the arithmetic device 230.

The arithmetic device 230 displays the detection result (the detection data including the interference fringe image), which is output from the detection device 220, on a monitor not shown in the drawing, or numerically calculates the wavefront aberration which occurs on the detection target surface 210a by analyzing the detection result, and displays a numerical value which, is obtained by the calculation, on the monitor.

In the Michelson interferometer, the lengths of the two optical paths are set to coincide with each other in a wavelength order. Therefore, it is not always necessary to use laser light, and white light or low coherence light may be used as a light source. However, in the case of using the white light or the low coherence light, it is necessary to make the lengths of the two optical paths accurately coincide with each other. In this case, even when there is light reflected from the lens surface and the like, the light does not become noise, and it is possible to accurately measure the surface shape.

It should be noted that, in the above-mentioned embodiment, a description was given of the exemplary case where the light source is an ArF excimer laser light source, but the invention is not limited to this. For example, as the light source, it may be possible to use an ultrahigh pressure mercury lamp that emits the g-line (a wavelength of 436 nm) and the i-line (a wavelength of 365 nm), or a KrF excimer laser (a wavelength of 248 nm), an $F_2$ laser (a wavelength of 157 nm), a KrF laser (a wavelength of 146 nm), a high-frequency wave generating device of a YAG laser, or a high-frequency wave generating device of a semiconductor laser.

Furthermore, harmonic waves may be used as the light source. The harmonic waves are generated by amplifying the infrared-range or visible-range single wavelength laser light through a fiber amplifier, and are wavelength-converted into ultraviolet light using a nonlinear optical crystal. The laser light is generated from a DFB semiconductor laser or a fiber laser. The fiber amplifier is doped with, for example, erbium (or both of erbium and ytterbium). For example, when the oscillation wavelength of the single wavelength laser is in the range of 1.51 to 1.59 μm, 8-times harmonic waves or 10-times harmonic waves are output. The generation wavelength of the 8-times harmonic waves is in the range of 189 to 199 nm, and the generation wavelength of the 10-times harmonic waves is in the range of 151 to 159 nm.

In particular, when the oscillation wavelength is in the range of 1.544 to 1.553 μm, it is possible to obtain 8-times harmonic waves of which the generation wavelength is in the range of 193 to 194 nm, that is, ultraviolet light with a wavelength substantially the same as that of the ArF excimer laser light. When the oscillation wavelength is in the range of 1.57 to 1.58 μm, it is possible to obtain 10-times harmonic waves of which the generation wavelength is in the range of 157 to 158 nm, that is, ultraviolet light with a wavelength substantially the same as that of the $F_2$ laser light. Further, when the oscillation wavelength is in the range of 1.03 to 1.12 μm, 7-times harmonic waves, of which the generation wavelength is in the range of 147 to 160 nm, are output. In particular, when the oscillation wavelength is in the range of 1.099 to 1.106 μm, it is possible to obtain 7-times harmonic waves of which the generation wavelength is in the range of 157 to 158 μm, that is, ultraviolet light with a wavelength substantially the same as that of the $F_2$ laser light. In this case, as the single wavelength oscillation laser, it is possible to use, for example, a ytterbium doped fiber laser.

Further, in the above-mentioned embodiment, a description was given of the exemplary case of using a material such as synthetic silica glass or fluorite (calcium fluoride) for various lenses such as the collimator lens, the base plate, and the relay lens which are disposed in the measurement apparatus, and the conic lens, the spherical lens, and the objective lens which constitute the light incidence means. However, the invention is not limited to this. For example, in accordance with the wavelength of the light emitted from the light source, the materials of the various lenses are appropriately selected from fluoride crystals such as fluorite (calcium fluoride: $CaF_2$), magnesium fluoride ($MgF_2$), lithium fluoride (LiF), barium fluoride ($BaF_2$), strontium fluoride ($SrF_2$), LiCAF (colquiriite: $LiCaAlF_6$), LiSAF ($LiSrAlF_6$), $LiMgAlF_6$, $LiBeAlF_6$, $KMgF_3$, $KCaF_3$, and $KSrF_3$, or mixed crystals thereof, or chemical materials, which transmit vacuum ultraviolet light, such as a silica glass doped with materials like fluorine or hydrogen.

Further, in the above-mentioned embodiment, the example of the wavefront aberration measurement for the reflection optical element was described, but the measurement apparatus according to the embodiment of the present invention is not limited to such an example. The illumination optical system according to an aspect of the present invention may be used in the measurement apparatus for measuring the wavefront aberration and the like of the transmitting optical element, as disclosed in, for example, PCT International Publication No. WO99/60361, PCT International Publication No. WO2006/016584, or PCT International Publication. No. WO2006/16584. Further, the illumination device according to an aspect of the present invention may be applied to a measurement apparatus that performs measurement on an optical system, as disclosed in, for example, PCT International Publication. No. WO2003/029751. In such a case, the illumination device according to the aspect of the present invention may be used instead of the pinhole of the conventional measurement apparatus. A detection target object (optical system) is irradiated with the spherical waves emitted from the illumination device as the measurement light, the measurement light passing through the detection target object (optical system) is guided into the detection device, and the optical characteristics such as the wavefront aberration are measured on the basis of the detection result. The illumination device according to an aspect of the present invention emits spherical waves with high accuracy and a high intensity. Therefore, even in a case of measuring the optical characteristics of the optical system or the transmitting optical element, in a similar manner to a case of the reflection optical element, it is possible to obtain the measurement result with a high S/N ratio with high accuracy. In addition, in the allowable range of the laws, the disclosures of the above-mentioned patent publications are incorporated herein by reference.

Eighth Embodiment

Next, an eighth embodiment will be described. In the following description, the components, which are the same as or equivalent to those of the above-mentioned embodiment, are represented by the same references and numerals, and a description thereof will be simplified or omitted here.

In the eighth embodiment, description will be given of an exemplary case where the optical element 1A (1B to 1D) described in the above-mentioned embodiment is used as a photomask.

Figure 18:
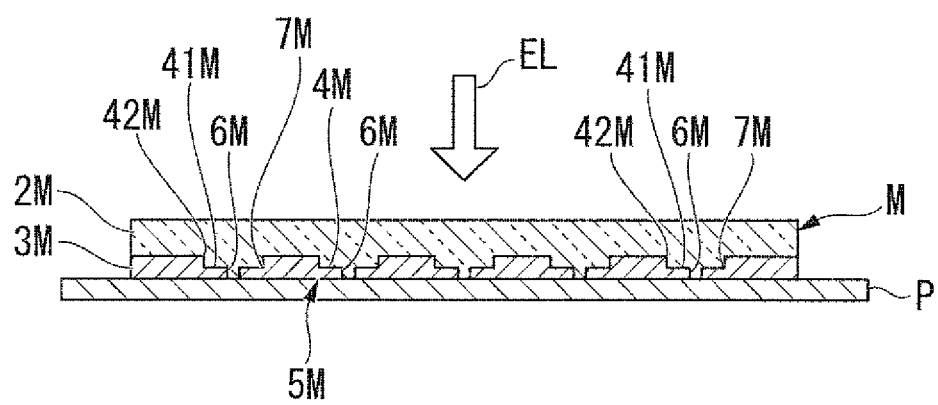
FIG. 18 is a diagram illustrating an example of a photomask according to an eighth embodiment.

FIG. 18 is a diagram illustrating an example of a photomask M according to the present embodiment. In FIG. 18, the photomask M includes a transparent member 2M that has an upper surface and a lower surface, and a metal film 3M that is disposed on the lower surface of the transparent member 2M. The metal film 3M has an incident surface 4M which is irradiated with the exposure light EL, an emission surface 5M of which at least a part faces the opposite direction of the incident surface 4M, and a hole 6M which is formed to connect the incident surface 4M and the emission surface 5M. In the metal film 3M, a plurality of the holes 6M are formed.

The incident surface 4M of the metal film 3M includes first surfaces 41M, which are disposed around ends of the holes 6M on the incident surface 4M side and have inner edges connected to inner surfaces of the holes 6M, and second surfaces 42M which are disposed around the first surfaces 41M and form discontinuous portions 7M between the second surfaces 42M and the outer edges of the first surfaces 41M. The distance between each inner edge and each outer edge is determined depending on the wavelength of the surface plasmons such that the intensity of the exposure light EL, which is emitted from the hole 6M to the emission surface 5M side, is increased due to the interference between the first surface plasmon group G1, which is excited at the inner edge due to the irradiation of the exposure light EL and travels toward the hole 6M, and the second surface plasmon group G2 which travels from the discontinuous portion 7M toward the hole 6M.

In the example shown in FIG. 18, each inner edge includes a corner that is formed between the first surface 41M and the inner surface of the hole 6M. Further, each discontinuous portion 7M includes a corner that is formed between the first surface 41M and the second surface 42M. The surface plasmons which travel from the discontinuous portion 7M toward the hole 6M include, for example, surface plasmons which are excited at the inner edge due to the irradiation of the exposure light EL and are reflected by the discontinuous portion 7M as described with reference to FIG. 4 and the like.

In addition, for example, as described with reference to FIG. 12 and the like, the second surface 42M is disposed around the first surface 41M so as to face the outer side with respect to the radial direction centered on the hole 6M (in an outward radial direction). The surface plasmons, which travel from the discontinuous portion 7M to the hole 6M, may include surface plasmons which are excited at the discontinuous portion 7M due to the irradiation of the exposure light EL.

In the example shown in FIG. 18, in a state where the photomask M is close to or in contact with the substrate P, the photomask M is illuminated with the exposure light EL. The metal film 3M is irradiated with the exposure light EL, with which the transparent member 2M of the photomask M is irradiated, through the transparent member 2M. Thereby, the exposure light EL is emitted from the holes 6M. The substrate P includes a glass substrate or a semiconductor wafer on which a film of a photosensitive material (photoresist) is formed. The substrate P is exposed to the exposure light EL which is emitted from the holes 6M.

Figure 19:
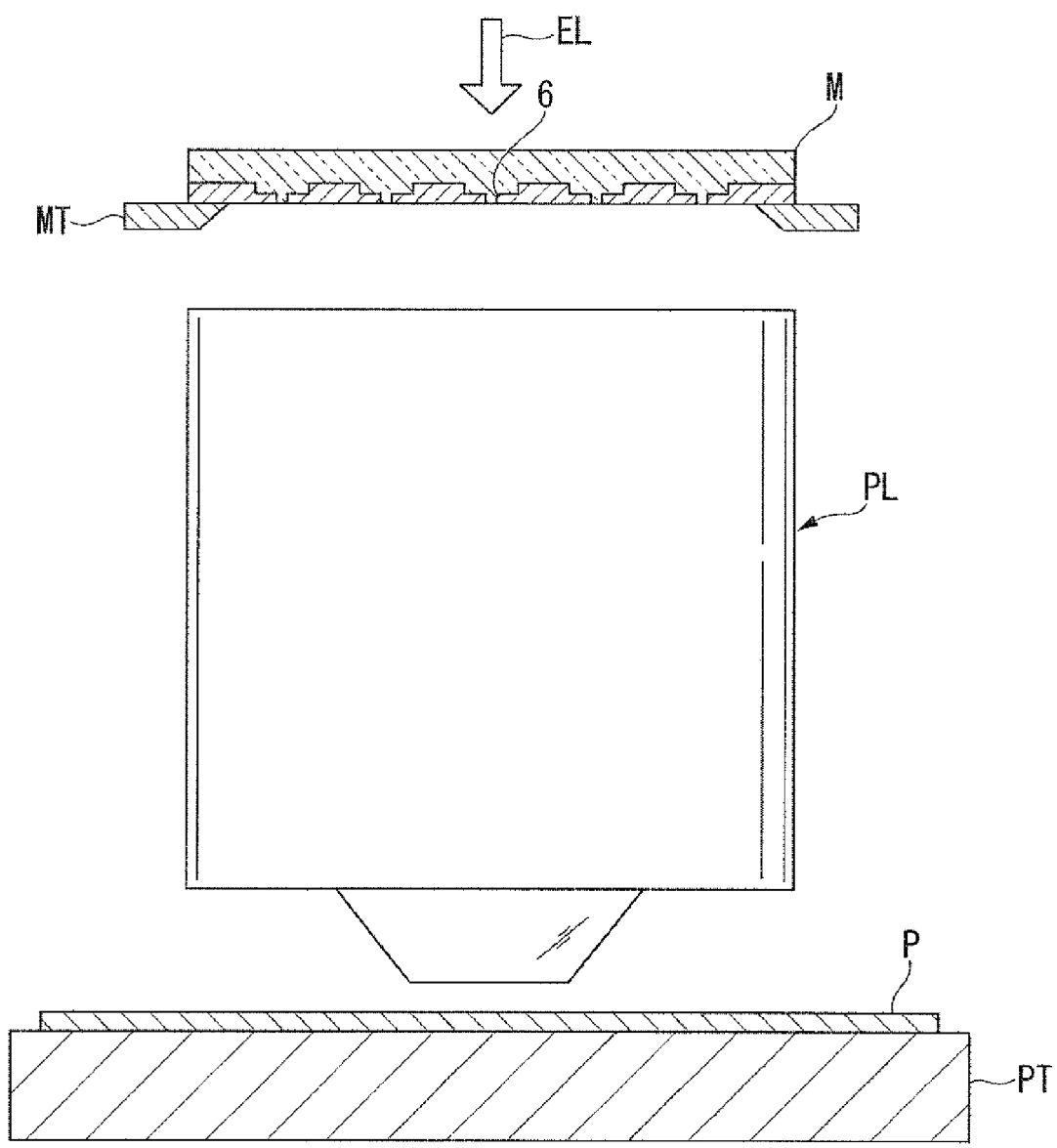
FIG. 19 is a diagram illustrating an example of a photomask according to the eighth embodiment.

FIG. 19 is a schematic diagram illustrating an example of an exposure apparatus EX using the photomask M. In FIG. 19, the exposure apparatus EX includes: a mask stage MT that is movable while holding the photomask M; a substrate stage PT that is movable while holding the substrate P; and a projection optical system PL that projects an image of the pattern (holes 6M) of the photomask M, which is illuminated with the exposure light EL, onto the substrate P. When the photomask M is illuminated with the exposure light EL, the exposure light EL excites the surface plasmons on the metal film 3. Thereby, the exposure light EL with a high intensity is emitted from the holes 6M with high accuracy. The substrate P is exposed to the exposure light EL from the photomask M.

As described above, the optical elements 1A to 1D described in the above-mentioned first to fourth embodiments can be used as the photomask M.

Figure 20:
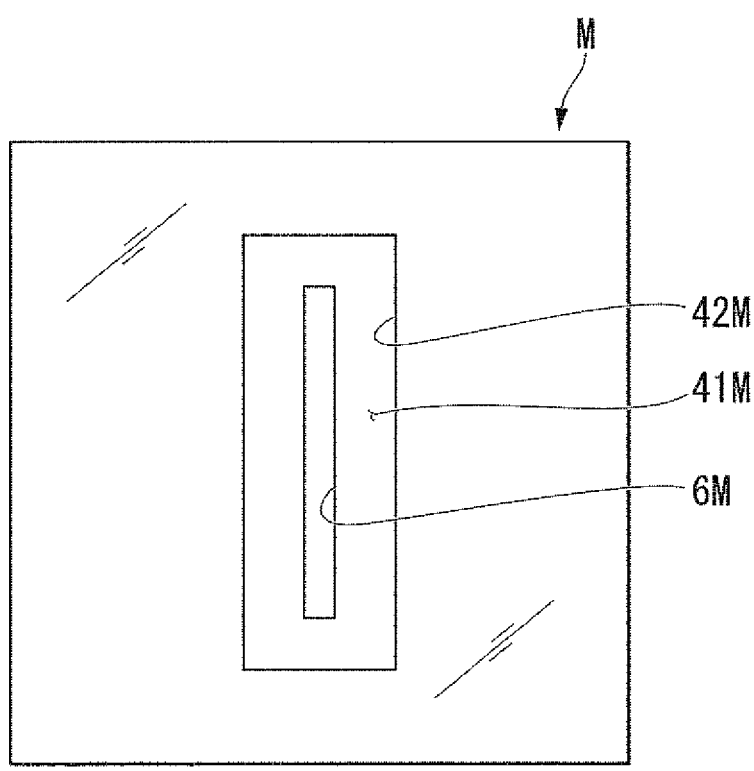
FIG. 20 is a diagram illustrating an example of a photomask according to the eighth embodiment.

It should be noted that the hole 6M of the photomask M may have a circular shape or may have a rectangular (slit) shape as shown in FIG. 20. Line-and-space patterns can be formed on the metal film 3M by forming a plurality of the holes 6M shown in FIG. 20.

Figure 21:
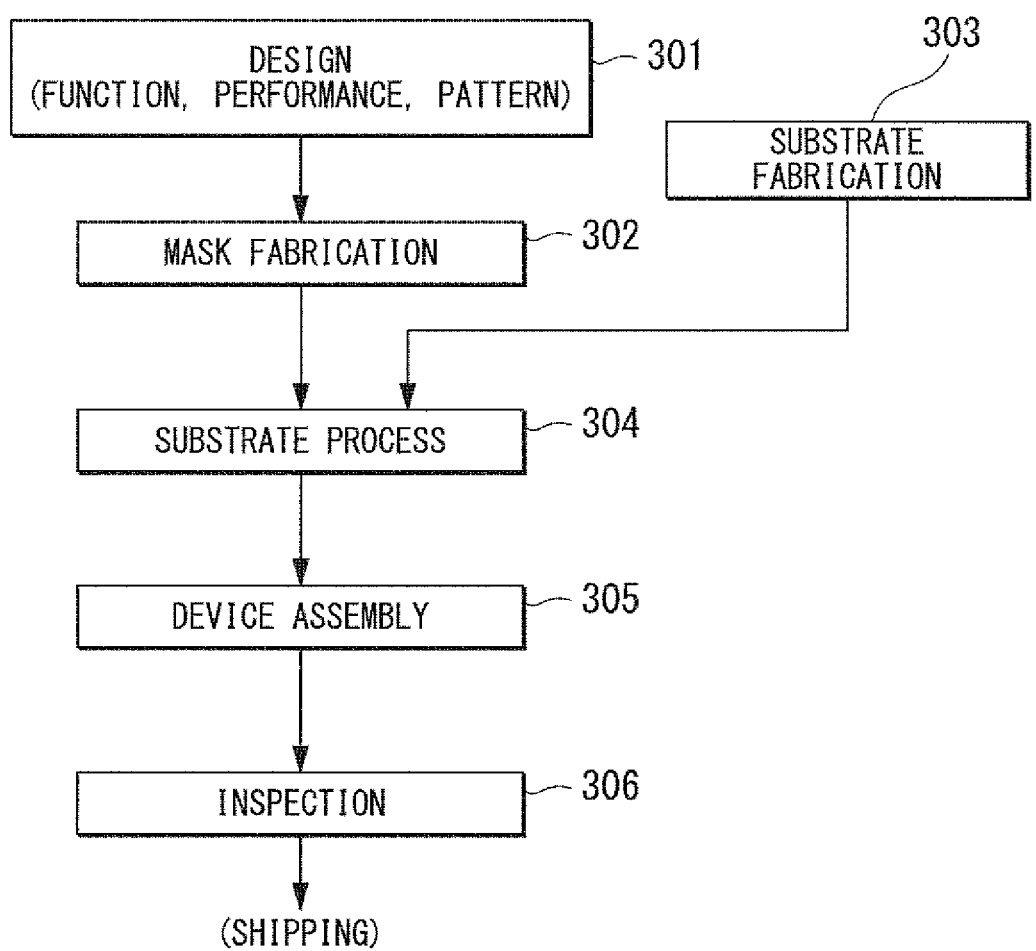
FIG. 21 is a flowchart illustrating an example of a process of manufacturing a micro device.

It should be noted that a micro device such as a semiconductor device may be manufactured through exposure using the photomask M. The micro device is manufactured, as shown in FIG. 21, through the following steps: a step 301 of designing the functions and the performance of the micro device; a step 302 of manufacturing the photomask (reticle) M on the basis of the designing step; a step 303 of manufacturing the substrate P as a base material of a device; a substrate process step 304 that includes a substrate process (exposure process) of illuminating the photomask with the exposure light EL, exposing the substrate P to the exposure light EL from the pattern (holes 6M) of the photomask M, in accordance with the above-mentioned embodiment, and developing the exposed substrate P; a device assembly step (includes fabricating processes such as a dicing process, a bonding process, and a package process) 305; an inspection step 306; and the like.

It should be noted that, in the optical element described in the above-mentioned embodiments, the second surface is set to be substantially perpendicular to the first surface (substantially parallel with the Z axis), but may not be set to be perpendicular to the first surface, and the second surface may be provided to be inclined on the first surface side or the third surface side.

It should be noted that the optical element described in the above-mentioned first to fourth embodiments may be used in a write/read head of an optical disc apparatus. In this case, in order to appropriately perform recording onto and reading from the optical disc, it is necessary to appropriately keep spacing between the emission surface of the optical element and optical disc, and thus it is preferable to form the emission surface of the optical element as smoothly as possible.

Ninth Embodiment

Next, an exposure apparatus, which has a function of measuring optical characteristics such as wavefront aberration, according to a ninth embodiment will be described. In the following description, the components, which are the same as or equivalent to those of the above-mentioned embodiment, are represented by the same references and numerals, and a description thereof will be simplified or omitted here.

Figure 22:
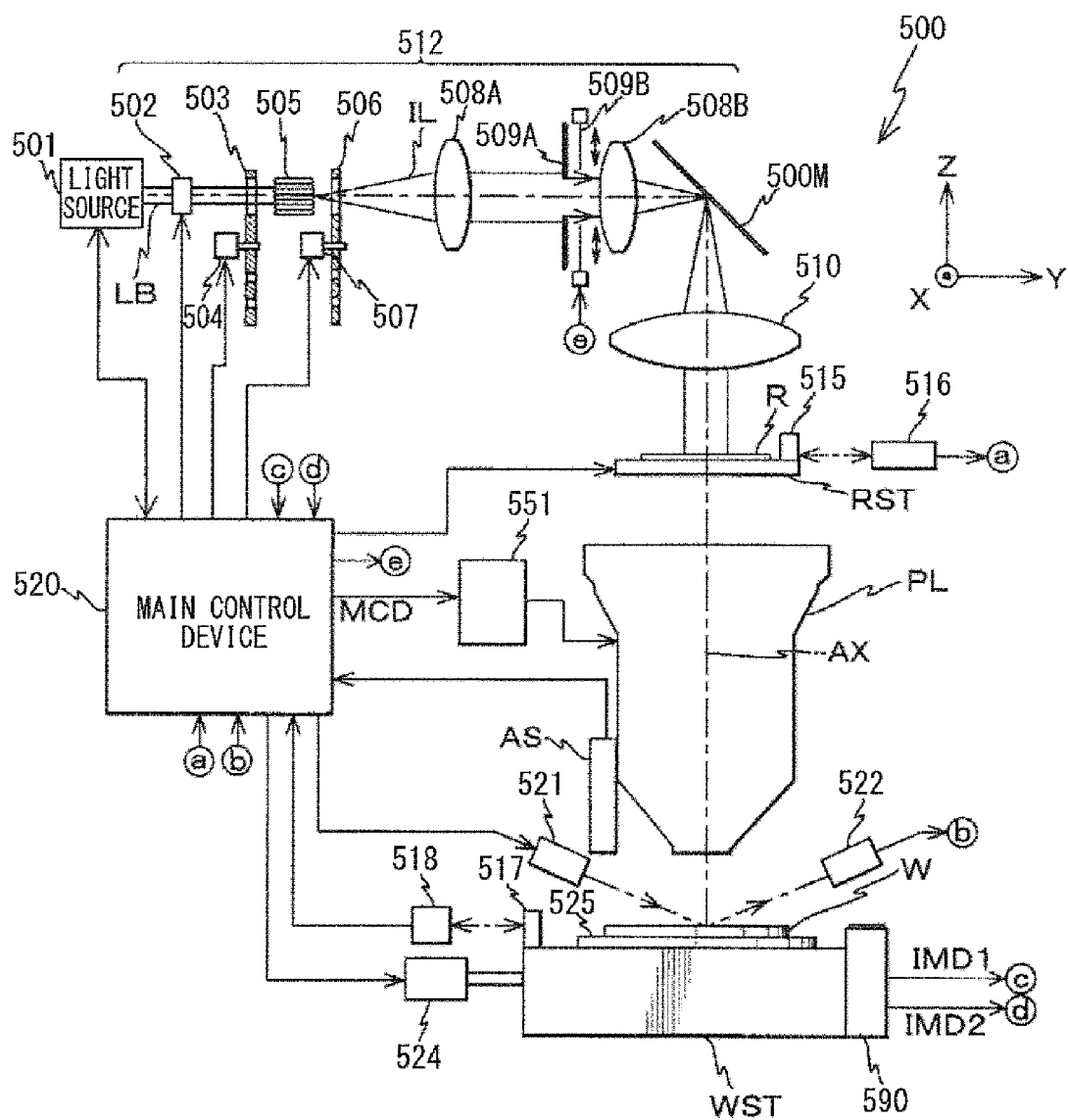
FIG. 22 is a diagram illustrating a schematic configuration of an exposure apparatus according to a ninth embodiment.

FIG. 22 schematically shows an entire configuration of an exposure apparatus 500. The exposure apparatus 500 is a step-and-scan-type projection exposure apparatus (scanning stepper (called a scanner)).

As shown in FIG. 22, the exposure apparatus 500 includes: an illumination system that includes a light source 501 and an illumination optical system 512; a reticle stage RST that holds a reticle R; a projection optical system PL; a main control device 520 that integrally controls a wafer stage WST, on which a wafer W is placed, and the entire apparatus; and the like.

As the light source 501, here, an ArF (argon fluorine) excimer laser light source (output wavelength 193 nm) is used. In the light source 501, laser light (illumination light), of which the main component is linear polarized light, is generated and output by at least one of bandwidth narrowing and wavelength selection.

In the example, the light source 501 is provided in a service room, which has a low cleanness degree, other than a clean room which is provided with a chamber (not shown in the drawing) housing the illumination optical system 512, the reticle stage RST, the projection optical system PL, and the wafer stage WST, and the like. The light source 501 is connected to the chamber, through a light delivery optical system which is not shown in the drawing and of which at least a part includes an optical system for adjusting the optical axis called a beam matching unit (BMU). In the light source 501, on the basis of the control information from the main control device 520, the internal controller controls on/off of the output of the laser beam. LB, energy per a single pulse of the laser beam LB, an oscillation frequency (cyclic frequency), values of the center wavelength and spectral half width, and the like.

The illumination optical system 512 includes a cylinder lens, a beam expander, a polarization control unit 502, a zoom optical system, a diffractive optical element unit, a polarization conversion unit, an optical integrator (homogenizer) 505, an illumination system aperture diaphragm plate 506, a first relay lens 508A, a second relay lens 508B, a stationary reticle blind 509A, a movable reticle blind 509B, an optical path deflecting mirror 500M, a condenser lens 510, and the like. In FIG. 22, the cylinder lens, the beam expander, the zoom optical system, and the diffractive optical element unit are omitted. As the optical integrator 505, a fly-eye lens, an internal-reflection-type integrator (rod integrator or the like), a diffractive optical element, or the like may be used. In the present embodiment, the fly-eye lens is used, and is thus hereinafter referred to as a "fly-eye lens 505".

The illumination optical system 512 is connected to the above-mentioned light delivery optical system through a light transmission window not shown in the drawing. The cross-section of laser beam LB, which is emitted as pulse light by the light source 501 and is incident through a light transmission window, is shaped by using, for example, the cylinder lens or the beam expander.

The polarization control unit 502 includes, for example, a ½ wavelength plate which is rotatable about the rotation axis as a center thereof. The rotation axis coincides with the optical axis of the illumination optical, system 512 (coincides with the optical axis AX of the projection optical system). When the shaped laser beam LB is incident onto the ½ wavelength plate, the phase of the component in a phase advancing axis direction advances by a ½ wavelength, relative to the phase of the component in a direction orthogonal to the phase advancing axis direction. Therefore, the polarization direction is changed. The change is determined depending on each rotation position of the phase advancing axis of the ½ wavelength plate and the polarization direction of the incident laser beam LB. In the polarization control unit 502, by adjusting the rotation position of the ½ wavelength plate, it is possible to control the polarization direction of the emitted laser beam LB. Under instruction of the main control device 520, the rotational position of the ½ wavelength plate is controlled by driving of the driving device not shown in the drawing.

It should be noted that, in a case where the laser beam LB emitted from the light source 501 is elliptically polarized light, in addition to the ½ wavelength plate, the polarization control unit 502 may have a ¼ wavelength plate which is rotatable about the rotation axis as a center thereof. The rotation axis coincides with the optical axis AX of the illumination optical system 512. In this case, the elliptically polarized laser beam is converted into linearly polarized light by the ¼ wavelength plate, and the polarization direction is adjusted by the ½ wavelength plate. Further, in the polarization control unit 502, an element, which cancels the polarization of the laser beam LB, may be detachably disposed on the optical path of the laser beam LB. Thereby, in the exposure apparatus 500, when the reticle R is illuminated, random polarization illumination can also be performed.

The laser beam LB, of which the polarization direction is adjusted in the polarization control unit 502, is incident into a diffractive optical element unit not shown in the drawings, through a zoom optical system which is formed by combination of convex lenses and concave lenses and is not shown in the drawings. In the diffractive optical element unit, a plurality of phase-type diffractive optical elements, which have different diffraction angles and directions of the diffracted light, are arranged in a turret-like member. Under instruction of the main control device 520, any one diffraction optical element of the plurality of diffractive optical elements is selectively disposed on the optical path of the laser beam. By switching the diffractive optical element disposed on the optical path of the laser beam LB, the cross-section of the laser beam LB can be formed in a desired shape. Typically, from the viewpoint of energy efficiency, a diffractive optical element which is disposed on the optical path is determined in accordance with the shape of the aperture diaphragm which is selected in the illumination system aperture diaphragm plate 506 to be described later. In this way, the laser beam LB is mostly condensed in an opening portion of the illumination system aperture diaphragm 503. This is advantageous in terms of energy efficiency.

The laser beam LB, of which the shape of the cross section is defined by the diffractive optical element disposed on the optical path, is incident into the polarization conversion unit 503.

The laser beam LB, which is emitted from the polarization conversion unit 503, is incident into the fly-eye lens 505. In order to illuminate the reticle R with a uniform illuminance distribution, the fly-eye lens 505 forms a surface light source, which is constituted of multiple point light sources (light source images), on the emission side focal plane (which substantially coincides with the pupil plane of the illumination optical system 512), through the incidence of the laser beam LB. The laser beam, which is emitted from the secondary light source, is hereinafter referred to as "illumination light IL".

In the vicinity of the emission side focal plane of the fly-eye lens 505, the illumination system aperture diaphragm plate 506, which is formed of a disc-shaped member, is disposed. The aperture diaphragms are disposed on the illumination system aperture diaphragm plate 506 with, for example, substantially equiangular spacings. The aperture diaphragms include, for example: an annular aperture diaphragm (annular illumination aperture diaphragm) for annular illumination; a modified aperture diaphragm (a quadrupolar illumination aperture diaphragm, a bipolar illumination aperture diaphragm) which is formed by eccentrically disposing a plurality of openings for a modified light source method; an aperture diaphragm (a normal illumination aperture diaphragm) which is formed of a normal circular opening; and the like.

The illumination system aperture diaphragm plate 506 is rotated by driving of the driving device 507 such as a motor which is controlled by the control signal sent from the main control device 520. Then, any one of the aperture diaphragms is selectively set on the optical path of the illumination light IL. Thereby, the shape and the size (light quantity distribution of the illumination light) of the secondary light source on the pupil plane are limited to an annular shape, a large circular shape, a quadruple eye shape, and the like. In addition, in the present embodiment, by using the illumination system aperture diaphragm plate 506, the light quantity distribution (the size and the shape of the secondary light source) of the illumination light IL on the pupil plane of the illumination optical system 512, that is, the illumination condition of the reticle R is changed. However, it is preferable to minimize loss in light quantity, which is caused by the above-mentioned change of the illumination condition, by varying the incident angle of the illumination light or the intensity distribution of the illumination light on the incident surface of the optical integrator (fly-eye lens) 505. Hence, it may be possible to employ a configuration in which, instead of the illumination system aperture diaphragm plate 506, or as a combination with that, for example, an optical unit is disposed between the light source 501 and the optical integrator (fly-eye lens) 505. The optical unit includes, for example, at least one of: a plurality of diffractive optical elements that is replaceably disposed on the optical path of the illumination optical system 512; at least one prism (such as a conic prism or a polyhedral prism) that is movable along the optical axis of the illumination optical system 512; and a zoom optical system.

A relay optical system, which is formed of a first relay lens 508A and a second relay lens 508B, is disposed on the optical path of the illumination light IL emitted from the illumination system aperture diaphragm plate 506, with the stationary reticle blind 509A and the movable reticle blind 509B interposed therebetween.

The stationary reticle blind 509A is disposed on a surface that is slightly defocused from the plane which is conjugate to the pattern surface of the reticle R, thereby forming a rectangular opening that defines the illumination region on the reticle R. Further, in the vicinity (the plane which is conjugate to the pattern surface of the reticle R) of the stationary reticle blind 509A, the movable reticle blind 509B is disposed. The movable reticle blind 509B has an opening portion of which the position and the width in the direction corresponding to each of a scanning direction (here the Y axis direction) and a non-scanning direction (the X-axis direction) are variable. At the start and the end of the scanning exposure, under the control of the main control device 520, the illumination region on the reticle R is further restricted by the movable reticle blind 509B, thereby preventing unnecessary exposure.

The deflecting mirror 500M is disposed on the optical path of the illumination light IL behind the second relay lens 508B constituting a relay optical system. The deflecting mirror 500M reflects the illumination light IL, which passes through the second relay lens 508B, toward the reticle R. The condenser lens 510 is disposed on the optical path of the illumination light IL behind the mirror 500M.

In the above-mentioned configuration, the incident surface of the fly-eye lens 505, the placement surface of the movable reticle blind 508B, and the pattern surface of the reticle R are set to be optically conjugate to one another. In addition, the diffractive optical elements of the diffractive optical element unit not shown in the drawing, the polarization conversion member of the polarization conversion unit 503, the emission side focal plane (the pupil plane of the illumination optical system 512) of the fly-eye lens 505, and the pupil plane of the projection optical system PL are set to be optically conjugate to one another. Further, the pattern surface of the reticle R and the pupil plane of the projection optical system PL have a Fourier transform relationship.

The operation of the illumination optical system 512, which is configured in this manner, is described as follows. While the cross-section of the laser beam LB, which is emitted as pulse light from the light source 501, is shaped, the beam is incident into the fly-eye lens 505 in a state where the polarization direction in the cross-section is defined in a desired direction by the polarization control unit 502 and the polarization conversion unit 503. Thereby, the above-mentioned secondary light source is formed on the emission side focal plane of the fly-eye lens 505.

The illumination light IL, which is emitted from the secondary light source, passes through any one of the aperture diaphragms on the illumination system aperture diaphragm plate 506, and passes through a rectangular opening of the stationary reticle blind 509A and the movable reticle blind 509B through the first relay lens 508A. Then, the light passes through the second relay lens 508, its optical path is deflected vertically downward by the mirror 500M, and the light passes through the condenser lens 510. Thereby, a rectangular illumination region on the reticle R, which is held on the reticle stage RST, is illuminated with uniform illuminance distribution.

The reticle R is fixed onto the reticle stage RST by, for example, vacuum suction. Here, the reticle stage RST is capable of being finely driven in the XY plane, which is perpendicular to the optical axis AX of the projection optical system PL, by the reticle stage driving system which is constituted of a linear motor and the like and is not shown in the drawing. In addition, the reticle stage RST is capable of being driven at a designated scanning velocity in the predetermined scanning direction (Y axis direction).

The position of the reticle stage RST in the stage movement plane is constantly detected with a resolution of, for example, about 0.5 to 1 nm, through a movable mirror 515, by a reticle laser interferometer (hereinafter referred to as a "reticle interferometer") 516. The position information (or velocity information) of the reticle stage RST from the reticle interferometer 516 is sent to the main control device 520, and then the main control device 520 moves the reticle stage RST through the reticle stage driving system (not shown in the drawing) on the basis of the position information (or velocity information).

The projection optical system PL is disposed below the reticle stage RST, and the direction of the optical axis AX is set as the Z-axis direction. The projection optical system PL is, for example, a reduction system which is telecentric on both sides, and includes a plurality of lens elements which have a common optical axis AX in the Z-axis direction and is not shown in the drawing. As the projection optical system PL, for example, a system with a projection magnification β of ¼, ⅕, ⅙, or the like is used. Hence, in the manner described above, when the illumination region on the reticle R is illuminated by the illumination light (exposure light) IL, a reduced image (partially inverted image) of the pattern formed on the reticle R with the projection magnification β is projected onto the slit-shaped exposure region on the wafer W, of which the surface is coated with a resist (photosensitizing agent), by the projection optical system PL.

In addition, in the present embodiment, among the plurality of lens elements, each of specific lens elements (for example, predetermined five lens elements) is independently movable. The movement of the specific lens element is performed by the driving elements such as three piezoelectric elements which are provided for each of the specific lens elements. That is, by separately driving these driving elements, it is possible to independently move each of the specific lens elements in parallel along the optical axis AX in accordance with the displacement amount of each driving element, and it is also possible to give the specific lens element a desired inclination relative to a plane which is perpendicular to the optical axis AX. In the present embodiment, the driving instruction signal for driving the driving elements is output by an imaging characteristic correction controller 551 on the basis of the instruction which is issued from the main control device 520. Thereby, the displacement amount of each driving element is controlled.

In the projection optical system PL configured in the manner described above, by the movement control of the lens element performed by the main control device 520 with aid of the imaging characteristic correction controller 551, it is possible to adjust various aberrations (a type of optical characteristics) such as distortion, image field curvature, astigmatism, comatic aberration, and spherical aberration.

The wafer stage WST is disposed on the base not shown in the drawing below the projection optical system PL, and a wafer holder 525 is placed on the upper surface thereof. The wafer W is fixed onto the wafer holder 525 by, for example, vacuum suction or the like.

The wafer stage WST is driven in the scanning direction (Y axis direction) and the non-scanning direction (X-axis direction), which is perpendicular to the scanning direction, by a wafer stage driving system 524 including a motor and the like. Then, a step-and-scan operation is executed by the wafer stage WST. The step-and-scan operation is to repeat a scanning operation and a moving operation. The scanning operation scans the wafer W relative to the reticle R in order to perform scan exposure on each shot region on the wafer W. The moving operation moves the wafer W to a scanning start position for the exposure of the next shot (acceleration start position).

The position of the wafer stage WST in the XY plane is constantly detected with a resolution of for example, about 0.5 to 1 nm, through a movable mirror 517, by a wafer laser interferometer (hereinafter referred to as a "wafer interferometer") 518. The position information (or velocity information) of the wafer stage WST is sent to the main control device 520, and then the main control device 520 controls the driving of the wafer stage WST through the wafer stage driving system 524 on the basis of the position information (or velocity information).

Further, the wafer stage WST is finely driven by the wafer stage driving system 524 also in the Z axis direction, a θx direction (a rotation direction around the X axis: pitching direction), a θy direction (a rotation direction around the Y axis: rolling direction), and a θz direction (a rotation direction around the Z axis: yawing direction). In addition, on a +Y side of the wafer stage WST, an optical characteristic measurement apparatus 590 to be described later is provided.

The alignment detection system AS is disposed on a side surface of the projection optical system PL. In the present embodiment, an image forming type alignment sensor that observes a street line or a position detection mark (a fine alignment mark) formed on the wafer W is used as the alignment detection system AS. The detailed configuration of the alignment detection system AS is disclosed in, for example, Japanese Unexamined Patent Application, First Publication No. H9-219354, and the corresponding U.S. Pat. No. 5,859,707, and the like. The observation results obtained by the alignment detection system AS are supplied to the main control device 520. In the allowable range of the laws, the disclosures of the publication and the U.S. patent are incorporated herein by reference.

In the apparatus shown in FIG. 22, a multipoint focus position detection system (521, 522) is provided that is one of the oblique-incidence-type focus detection systems (focal point detection systems) for detecting the position in the Z axis direction (the direction of the optical axis AX) within the exposure region and the regions around the exposure region on the surface of wafer W. The detailed configuration of the multipoint focus position detection system (521, 522) and the like are disclosed in, for example, Japanese Unexamined Patent Application, First Publication No. H6-283403, and the corresponding U.S. Pat. No. 5,448,332, and the like. The detection results obtained by the multipoint focus position detection system (521, 522) are supplied to the main control device 520. In the allowable range of the laws, the disclosures of the publication and the U.S. patent are incorporated herein by reference.

Figure 23:
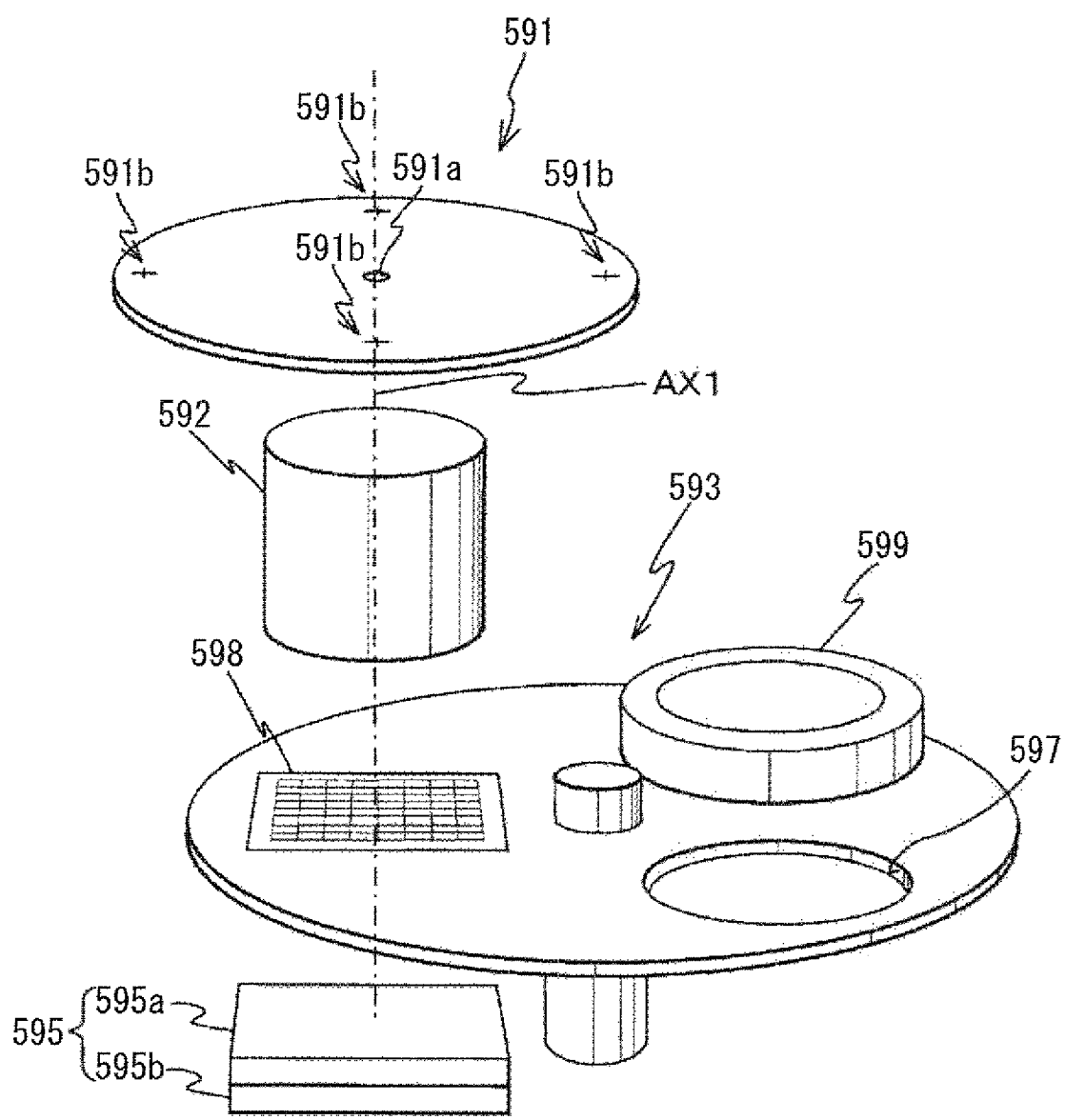
FIG. 23 is a diagram illustrating a configuration of an optical characteristic measurement apparatus.

Next, the optical characteristic measurement apparatus 590 provided on the wafer stage WST will be described. FIG. 23 schematically shows components that are disposed on the upper surface or the inside of a casing of the optical characteristic measurement apparatus 590 shown in FIG. 22. As shown in FIG. 23, the optical characteristic measurement apparatus 590 includes a marking plate 591, a collimator optical system 592, an optical system unit 593 and a photoreceiver 595.

The marking plate 591 is disposed at a height position (the position in the Z axis direction) that is the same as the surface of the wafer W held on the wafer stage WST so as to be orthogonal to the optical axis AX (refer to FIG. 22). On the surface of the marking plate 591, a light shielding film also serving as a reflection film is formed by vapor deposition of a metal such as chromium, and a circular opening 591a is formed in the center portion of the light shielding film. The light shielding film can shield unnecessary light from entering the collimator optical system 592 when the wavefront aberration of the projection optical system PL is measured. Further, three or more (four in FIG. 23) two-dimensional position detection marks 591h are formed around the opening 591a of the light shielding film, where the positional relationship between the marks and the opening 591a is known in design. As the two-dimensional position detection mark 591, in the present embodiment, a cross mark is employed. The cross mark can be detected by the above-mentioned alignment detection system AS. In another embodiment, a mark other than the cross mark may be used.

In the present embodiment, the collimator optical system 592 is disposed below the marking plate 591. The illumination light IL passing through the opening 591a of the marking plate 591 is converted into parallel light, which travels vertically downward, by the collimator optical system 592.

In the optical system unit 593, an opening portion 597, a micro lens array 598, and a polarization detection system 599 are arranged with spacings of a predetermined angle centered on a predetermined rotation axis. By the rotation about the rotation axis, any one of the opening portion 597, the micro lens array 598, and the polarization detection system 599 can be disposed selectively on an optical path (a position corresponding to the optical axis AX1) of the light passing through the collimator optical system 592. The rotation about the rotation axis is performed by a driving device, which is not shown in the drawing, under the instruction of the main control device 520.

The opening portion 597 makes the parallel light, which is emitted from the collimator optical system 592, pass therethrough directly. The opening portion 597 is disposed on the optical path of the illumination light IL, whereby the photoreceiver 595 is able to measure a pupil image. Here, the pupil image indicates a light source image that is formed on a pupil plane of the projection optical system PL by the light incident into the projection optical system PL through a pinhole pattern to be described later. It should be noted that the opening portion 597 may include a transmitting member that directly transmits the parallel light.

The micro lens array 598 is constituted of a plurality of small lenses (micro lenses) that are disposed in an array shape within a plane orthogonal to the optical path. More specifically, the micro lens array 598 is an array in which multiple square-shaped micro lenses having equal side lengths are densely arranged in a matrix shape. Incidentally, the micro lens array 598 is produced by performing an etching process on a plane-parallel glass plate. In the micro lens array 598, each micro lens emits an image-forming beam of an image passing through a later-described pinhole pattern which is formed at the opening 591a of the marking plate 591.

The photoreceiver 595 includes a light receiving element (hereinafter referred to as a "CCD") 595a formed of a two-dimensional CCD and the like, an electric circuit 595b such as, for example, charge-transfer control circuit, and the like. The CCD 595a has enough area for receiving all beams that are incident into the collimator optical system 592 and are emitted from the micro lens array 598. Further, the CCD 595a has a light receiving surface on a plane, which is an imaging plane on which an image of the later-described pinhole pattern formed at the opening 591a is formed again by each micro lens of the micro lens array 598, and which is optically conjugate to the formation plane of the opening 591a. In addition, the light receiving surface is located on a plane, which is slightly shifted from a plane conjugate to a pupil plane of the projection optical system PL, in a state where the opening portion 597 is disposed on the optical path.

The main control device 520 includes the so-called microcomputer (or workstation) that is constituted by a CPU (Central Processing Unit), an internal memory such as ROM (Read Only Memory) and RAM (Random Access Memory), and the like. The overall control of the exposure apparatus 500 is realized by the CPU executing the program loaded on the internal memory (RAM).

Next, exposure operations of the exposure apparatus 500 in the present embodiment will be described in accordance with flowcharts in FIGS. 24 to 27 that show simplified processing algorithms of the main control device 520. Incidentally, here, a description will be given on the assumption that exposure of a first layer on the wafer W has been already completed and exposure of second and subsequent layers will be performed.

Figure 24:
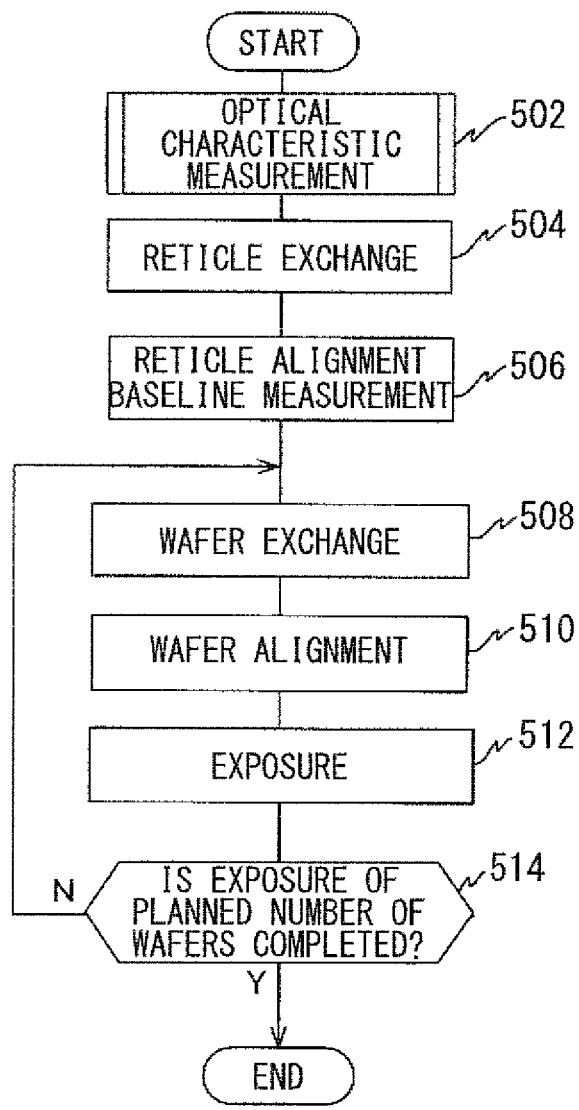
FIG. 24 is a flowchart illustrating a process of a main control device at the time of an exposure operation.
Figure 25:
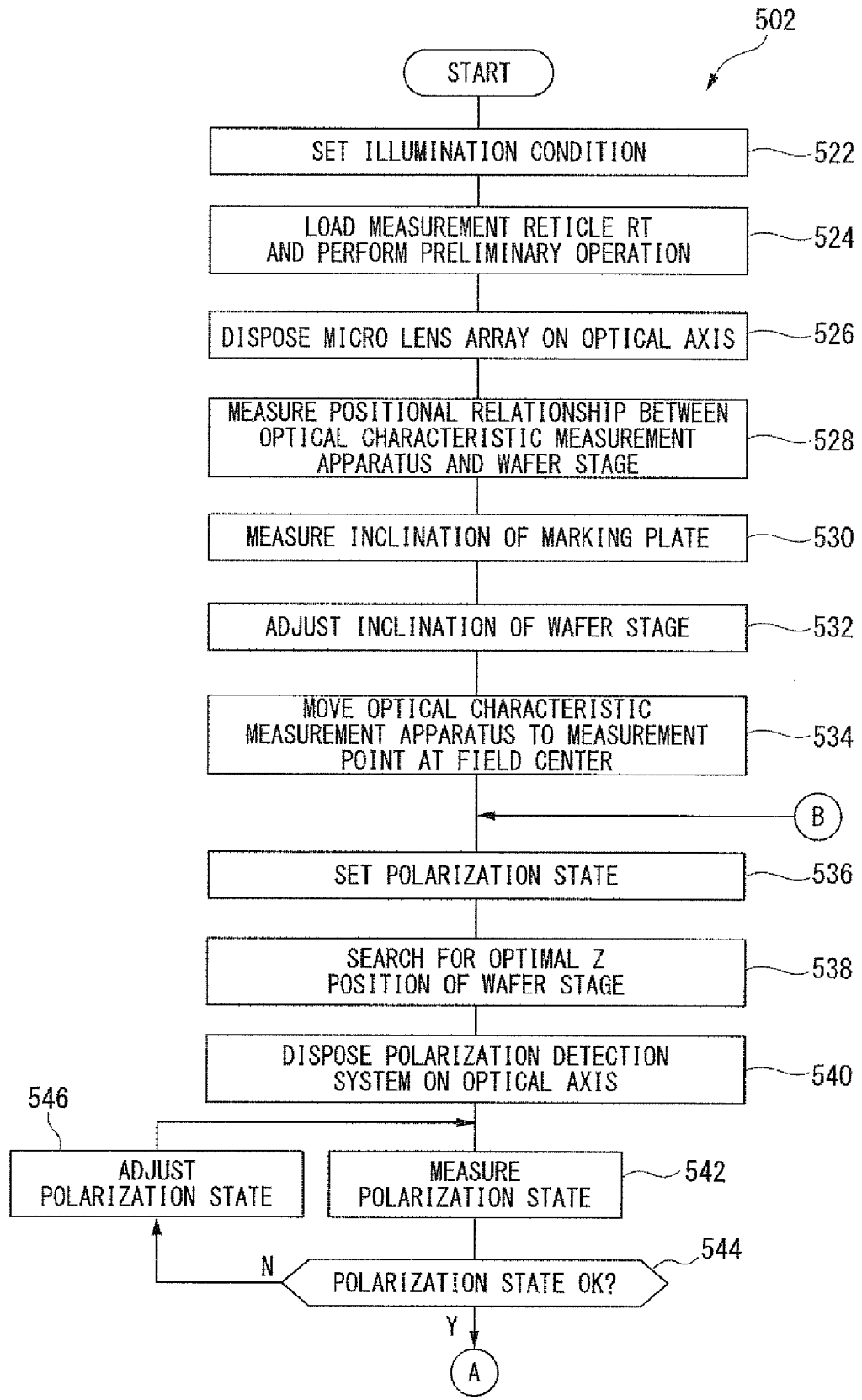
FIG. 25 is a flowchart illustrating a process of measuring optical characteristics.

As shown in FIG. 24, first, in step 502, subroutine processing of optical characteristic measurement is performed. In subroutine 502, first, in step 522 in FIG. 25, an illumination condition for performing optical characteristic measurement is set. Specifically, the main control device 520 sets the polarization of the laser beam LB to the F1 polarization in polarization control unit 502, rotates the illumination system aperture diaphragm plate 506 by driving the driving device 507, and places a general illumination aperture diaphragm 506D on the optical path of the illumination light IL. In addition, the main control device 520 rotates the polarization conversion unit 503 by driving the driving device 504 and places an opening portion 503D on the optical path of the laser beam LB. Thereby, the reticle R can be illuminated through the general aperture diaphragm by the exposure apparatus 500. In this case, a pupil image formed in the pupil plane of the projection optical system PL has a circular shape.

Figure 28:
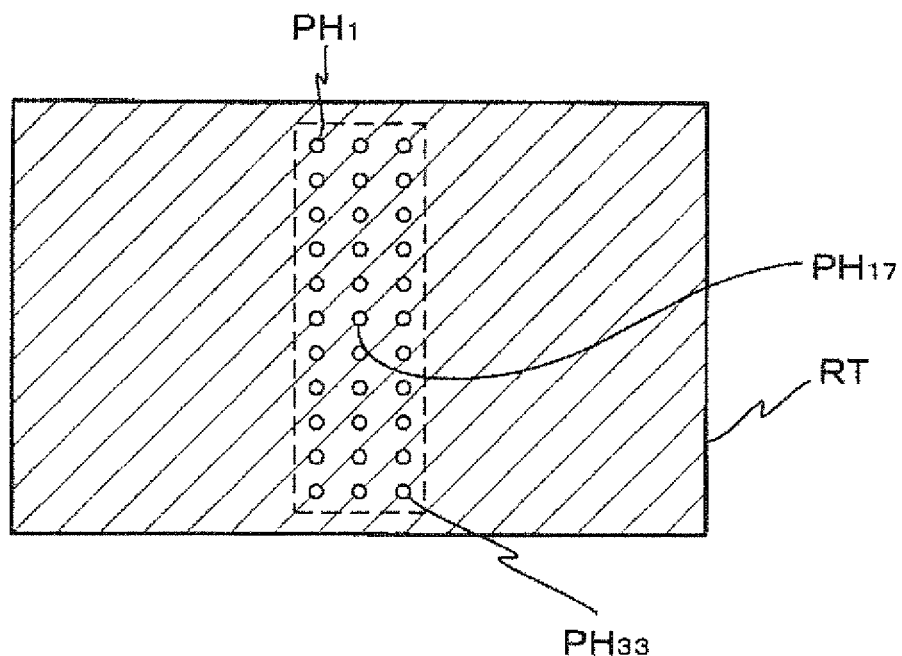
FIG. 28 is a diagram illustrating an example of a measurement reticle.

Next, in step 524, a measurement reticle shown in FIG. 28 is loaded on the reticle stage RST by using a reticle loader not shown in the drawing, and a predetermined preliminary operation is performed.

On the measurement reticle RT, as shown in FIG. 28, a plurality of pinhole patterns (in FIG. 28, 3×11=33 pinhole patterns $PH_n$ (n=1 to 33)) are arranged in a matrix, of which the row direction is the X axis direction and the column direction is the Y axis direction, in a state where the measurement reticle RT is loaded on the reticle stage RST. In the present embodiment, the structure of the pinholes on the measurement reticle RT is the same as the structures of the pinholes of the optical element 1A shown in FIG. 1, the optical element D shown in FIG. 7, or the optical element 1D shown in FIG. 9. In addition, the pinhole patterns $PH_1$ to $PH_{33}$ are formed in a region having a size of a slit-shaped illumination region indicated by the dotted line in FIG. 28.

In this case, as the predetermined preliminary operation, detection of a relative position of the measurement reticle RT to the projection optical system PL, baseline measurement of the alignment detection system AS, and the like are performed. That is, using a reticle alignment system not shown in the drawing, a positional relationship is detected between a pair of first reference marks formed on a reference mark plate, which is not shown in the drawing, on the wafer stage WST and images of reticle alignment marks, which correspond to the first reference marks, on the measurement reticle RT through the projection optical system PL. The detection of the positional relationship is performed in a state where the reticle stage RST is moved to a position at which the region indicated by the dotted line in FIG. 28 on the measurement reticle RT substantially coincides with the above-mentioned illumination region. Subsequently, by moving the wafer stage WST a predetermined distance within the XY plane, a positional relationship with respect to the detection center of the alignment detection system AS is detected, and the baseline of the alignment detection system AS is measured on the basis of the two positional relationships and the measurement values of interferometers 516 and 518 at the time of detecting the respective positional relationships.

In step 526, the micro lens array 598 is disposed on the optical axis AX1 by rotating the optical system unit 593 of the optical characteristic measurement apparatus 590.

In step 528, a positional relationship between the wafer stage WST and the optical characteristic measurement apparatus 590 mounted on the wafer stage WST is measured. Specifically, by sequentially moving the wafer stage WST, each position on a wafer stage coordinate system of the at least two two-dimensional position marks 591b on the marking plate 591 of the optical characteristic measurement apparatus 590 is detected using the alignment detection system AS. On the basis of the detection results of the positions, a positional relationship between the wafer stage WST and the opening 591a of the marking plate 591 of the optical characteristic measurement apparatus 590 is accurately obtained using a predetermined statistical computation, for example, such as the least-squares method.

As a result, on the basis of position information (velocity information) which is output from the wafer interferometer 518, the XY position of the opening 591a can be accurately detected. In addition, a position of the opening 591a can be set at a desired XY position with good accuracy, by controlling the position of the wafer stage WST, on the basis of the detection result of the XY position and the baseline measured in advance.

In step 530, an inclination of the marking plate 591 with respect to a plane (the XY plane) perpendicular to the optical axis AX of the projection optical system PL is measured, using the multipoint focus position detection system (521, 522). Subsequently, in step 532, by adjusting an inclination of the wafer stage WST on the basis of the measurement result of the inclination of the marking plate 591, an inclination of the upper surface of the marking plate 591 is made to coincide with an inclination of an image plane (or an approximate plane of the image plane) of the projection optical system PL.

In step 534, the wafer stage WST is moved such that the opening 591a of the marking plate 591 of the optical characteristic measurement apparatus 590 coincides with a datum measurement point in the field of the projection optical system PL, for example, a measurement point at the field center, that is, a measurement point at a conjugate position (on the optical axis AX) of the pinhole pattern $PH_{17}$ in the projection optical system PL shown in FIG. 28. Thereby, the optical axis AX of the detection target optical systems (the illumination optical system 512 and the projection optical system PL) is made to coincide with the optical axis AX1 of the optical characteristic measurement apparatus 590.

In step 536, a polarization state of the illumination light IL is set. Specifically, the main control device 520 adjusts a polarization direction of the laser beam LB by rotating the ½ wavelength plate or the like in the polarization control unit 502. In this case, a rotation amount of the ½ wavelength plate is adjusted such that the illumination light IL becomes the H polarized light.

In step 538, an optimal Z position (a best focus position) of the wafer stage WST is searched for, on the basis of captured image data IMD1 that is the imaging results of the image of the pinhole pattern $PH_{17}$ formed again on the light receiving surface of the CCD 595a by each micro lens constituting the micro lens array 598. Hereinafter, the search processing will be described in detail.

Figure 29A:
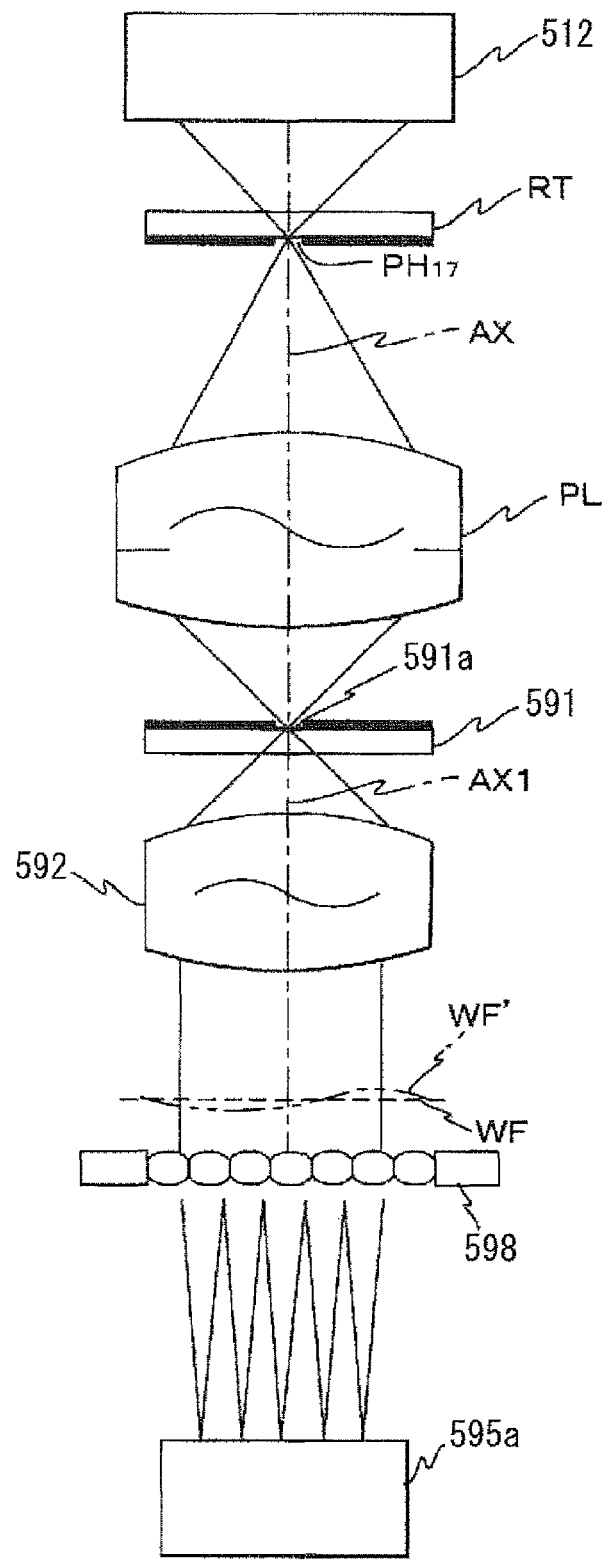
FIG. 29A is a diagram illustrating optical arrangement at the time of measuring a pupil image.

In the optical arrangement at the time of performing the search for the optimal Z position, the optical elements are arranged along the optical axis AX1 of the optical characteristic measurement apparatus 590 and the optical axis AX of the projection optical system PL, as shown in FIG. 29A. In the optical arrangement shown in FIG. 29A, when the main control device 520 causes the light source 501 to generate the laser beam LB and the illumination light IL is emitted from illumination optical system 512, the light which reaches the pinhole pattern $PH_{17}$ of the measurement reticle RT (the illumination light IL), is emitted from the pinhole pattern $PH_{17}$ as spherical waves. Then, the light is made to pass through the projection optical system PL, and is thereafter condensed at the opening 591a of the marking plate 591 of the optical characteristic measurement apparatus 590. Incidentally, the light which passes through the pinhole patterns $PH_1$ to $PH_{16}$ and $PH_{18}$ to $PH_{33}$ other than the pinhole pattern $PH_{17}$ does not reach the opening 591a. The wavefront of the light which is condensed at the opening 591a in the above-mentioned manner (the beam of the image of the pinhole pattern $PH_{17}$ formed inside the opening 591a on the surface of the marking plate 591) becomes an approximate sphere which includes the wavefront aberration of the projection optical system PL.

The light passing through the opening 591a is converted by the collimator optical system 592 into parallel light and is incident into the micro lens array 598. Each micro lens (refer to FIG. 29A) of the micro lens array 598 forms an image of the pinhole pattern $PH_{17}$, which has been formed inside the opening 591a on the surface of the marking plate 591, on an optically conjugate plane of the marking plate 591, that is, the image capturing surface (the light receiving surface) of the CCD 595a. Accordingly, on the image capturing surface of the CCD 595a, spot images (images of the pinhole pattern $PH_{17}$), of which the arrangement and the number correspond to those of micro lenses constituting the micro lens array 598, are formed. The CCD 595a captures the spot images formed on the image capturing surface (the light receiving surface). The captured image data IMD1, which is obtained by the image capturing of the CCD 595a, is transmitted to the main control device 520.

Then, while stepping the wafer stage WST in the Z axis direction through the wafer stage driving system 524, the captured image data IMD1 is acquired. On the basis of the acquired captured image data IMD1 the optimal. Z position of the wafer stage WST is searched for by finding a position in the Z axis direction where, for example, contrast of spot images is maximized.

In step 540, the polarization detection system 599 is disposed on the optical axis AX1 of the illumination light IL by rotating the optical system unit 593. In step 542, a polarization state of the illumination light IL is measured. Thus, as an example, the main control device 520 calculates Stokes parameters.

In step 544, the main control device 520 determines whether or not the illumination light IL becomes the H polarized light, on the basis of the calculated values of the Stokes parameters. If the determination result is positive, the procedure advances to step 552 in FIG. 26. In contrast, if the determination result in step 544 is negative, the procedure advances to step 546, in which the polarization state of the illumination light IL is adjusted by adjusting the polarization control unit 502 on the basis of the calculated values of the Stokes parameters. For example, when the illumination light IL has a strong elliptic polarized nature, a polarizer within the polarization control unit 502 is adjusted such that the illumination light IL becomes linearly polarized light. When the illumination light IL is a linearly polarized light but the polarization direction is deviated from the X axis direction, a rotation amount of the ½ wavelength plate within the polarization control unit 502 is adjusted so as to make the polarization direction become the X axis direction, that is, become the H polarization. After step 546 ends, the procedure returns to step 542.

Afterward, until the determination result in step 544 is positive, the polarization state of the illumination light IL is adjusted in step 546 by, for example, performing rotation adjustment of the ½ wavelength plate or the ¼ wavelength plate of the polarization control unit 502, or the like, and then the procedure returns to step 542, and the processing for measuring the polarization state of the illumination light IL as described above is repeated again. Thereby, eventually the illumination light IL becomes the H polarized light.

Figure 26:
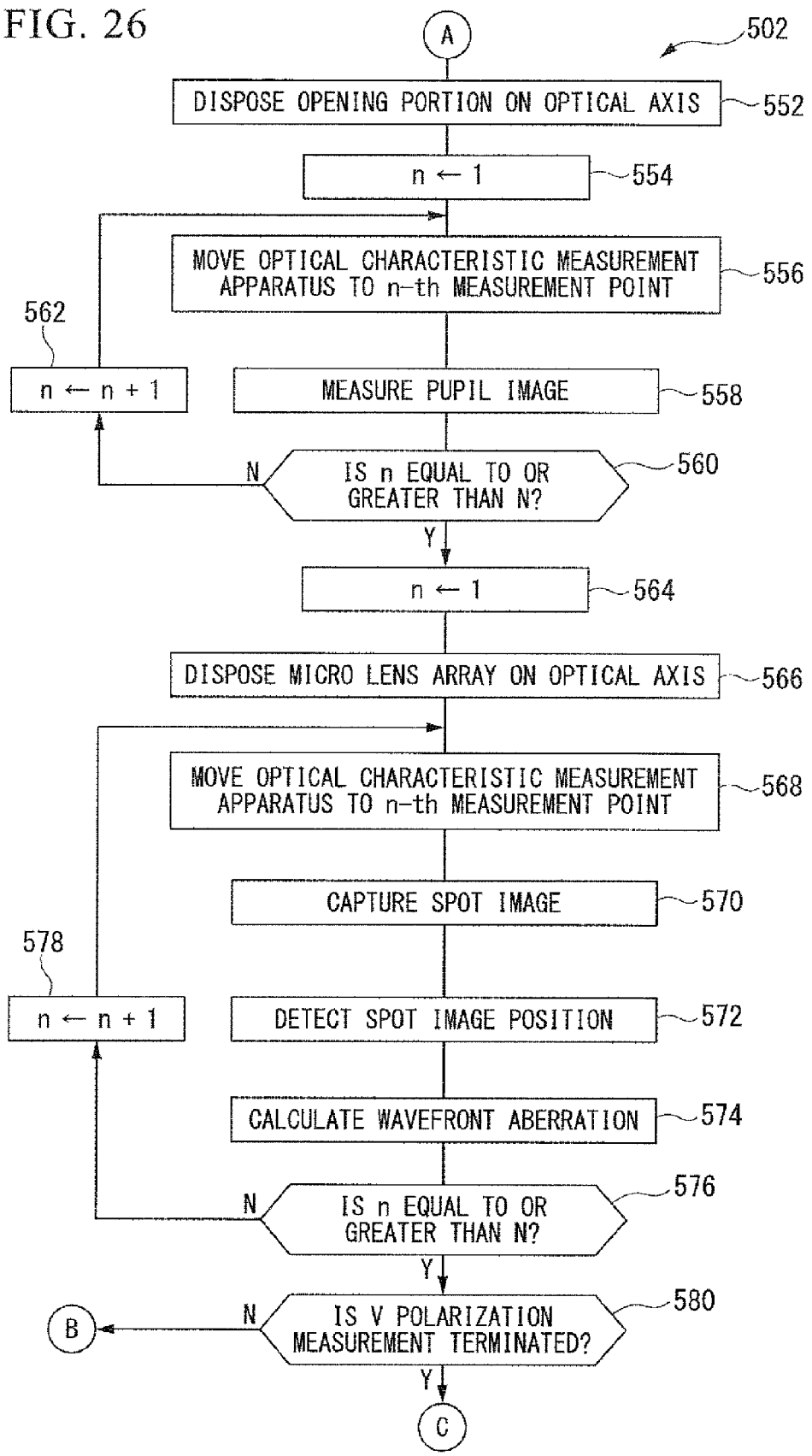
FIG. 26 is a flowchart illustrating the process of measuring the optical characteristics.

After the illumination light IL is adjusted so as to be the H polarized light in this manner, in step 552 in FIG. 26, the opening portion 597 is disposed on the optical axis AX1 by rotating the optical system unit 593. In next step 554, a value of a counter n (hereinafter referred to as a "counter value n") is initialized to one.

In step 556, the optical characteristic measurement apparatus 590 is moved to the n-th (first in this case) measurement point. That is, the wafer stage VAST is moved such that the opening 591a of the marking plate 591 of the optical characteristic measurement apparatus 590 coincides with the measurement point at a conjugate position of the n-th pinhole pattern $PH_n$ in the projection optical system PL.

Figure 29B:
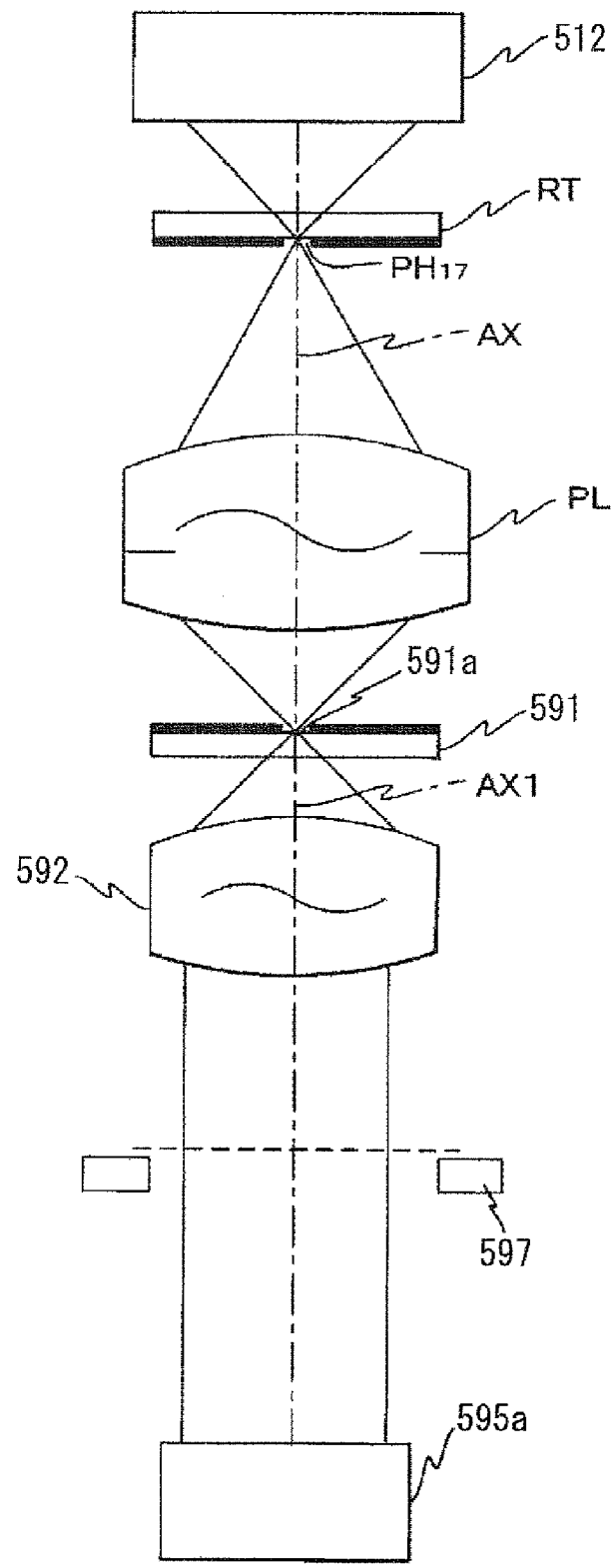
FIG. 29B is a diagram illustrating optical arrangement at the time of measuring a wavefront aberration.

Next, in step 558, pupil image measurement is performed. FIG. 29B shows a state of the pupil image measurement. As shown in FIG. 29B, in this state, the opening portion 597 is disposed on the optical path of the illumination light IL. Hence, the parallel light, which passes through the collimator optical system 592, is directly incident into the CCD 595a. In other words, the CCD 595a can be regarded to be disposed at a position conjugate to the pupil plane of the projection optical system PL, and is able to receive the beam corresponding to the pupil image on the pupil plane. In this case, the captured image data IMD2 of the CCD 595a is acquired, and the center position and size of the pupil image or the intensity distribution of the pupil images is detected, on the basis of the captured image data IMD2. Then, the detection results are stored in a memory.

In step 560, the determination is made of whether or not the pupil image measurement is completed at all measurement points, by determining whether or not the counter value n is equal to or greater than the total number N (N=33 in this case) of the measurement point. Here, since only the pupil image measurement at the first measurement point has ended, the determination result in step 560 is negative. Then, the procedure advances to step 562, the counter value n is incremented by one, and the procedure returns to step 556.

Thereafter, until the determination result in step 560 is positive, the processing and determination of a loop of steps 556→558→560→562 are repeated. Thereby; the pupil image measurement is performed at the 2nd to 33rd measurement points within the field of the projection optical system PL, that is, at the measurement points at the conjugate positions of the pinhole patterns $PH_2$ to $PH_{33}$ in the projection optical system PL. In addition, the center position and size of the pupil image, which passes through each of the pinhole patterns $PH_2$ to $PH_{33}$, or the intensity distribution of the pupil images is calculated and stored in a memory.

When the pupil image measurement at all measurement points is completed, the procedure advances to step 564, and the counter value n is initialized to one.

In step 566, the micro lens array 598 is disposed again on the optical axis AX1 by rotating the optical system unit 593, then in step 568, the optical characteristic measurement apparatus 590 is moved to the n-th (first in this case) measurement point. That is, the wafer stage WST is moved such that the opening 591a of the marking plate 591 of the optical characteristic measurement apparatus 590 coincides with the measurement point at a conjugate position of the n-th pinhole pattern $PH_n$ in the projection optical system PL.

In steps 570 to 574, the wavefront aberration measurement at the n-th measurement point is performed. First, in step 570, all spot images formed on the light receiving surface of the CCD 595a by the micro lens array 598 are captured, whereby the captured image data IMD1 is acquired.

In step 574, the position information on each spot image is read out from the memory, and the wavefront aberration of the projection optical system PL related to the light, which passes through the n-th (first in this case) the pinhole pattern $PH_1$ of the measurement reticle RT, is calculated.

Here, the reason why the wavefront aberration can be measured from the position information on the spot image is that the wavefront aberration of the projection optical system PL is reflected in the wavefront of the light, which is incident into the micro lens array 598, when the spot image is captured.

In other words, when there is no wavefront aberration in the projection optical system PL, a wavefront WF becomes a plane orthogonal to the optical axis AX1 as shown by the dotted line in FIG. 29A. In this case, the wavefront of the light, which is incident into the micro lens array 598, is orthogonal to the optical axis, and the spot image, which has the center at the intersection point between the optical axis of each micro lens of the micro lens array 598 and the image capturing surface of the CCD 595a, is formed on the light receiving surface of the CCD 595a. Meanwhile, when there is the wavefront aberration in the projection optical system PL, as indicated by the chain double-dashed line in FIG. 29A, a wavefront WF' does not become a plane orthogonal to the optical axis AX1, but becomes an inclined surface having an angle according to a position of the wavefront WF' on the plane. In this case, the wavefront of the light incident into the micro lens array 598 is inclined, and the spot image, which has the center at a point deviated by a distance corresponding to the inclined amount from the intersection point between the optical axis of each micro lens of the micro lens array 598 and the light receiving surface of the CCD 595a, is formed on the light receiving surface of the CCD 595a.

Accordingly, in step 574, the wavefront aberration of the projection optical system PL related to the light, which passes through the n-th pinhole pattern $PH_n$ of the measurement reticle RT, is calculated, by obtaining a coefficient of a Zernike polynomial from the difference (the position error) between the position of each spot image expected when there is no wavefront aberration (the intersection point between the optical axis of each micro lens of the micro lens array 598 and the image capturing surface of the CCD 595a) and the detected position of each spot image.

However, the position of each spot image, which is expected when there is no wavefront aberration, coincides with the intersection point between the optical axis of each micro lens of the micro lens array 598 and the light receiving surface of the CCD 595a, only in an ideal case where the optical axis AX1 and the CCD 595a are accurately orthogonal to the optical axis of the incident light. Thus, in the present embodiment, when the position error is calculated, on the basis of data on the light source image (the position information on the light source image such as the center position and the size) at the corresponding measurement point stored in the memory, each position of each spot image which is expected when there is no wavefront aberration (a datum position used to calculate a deviation amount of each spot image), is corrected, and the difference between the detected position of each spot image and each corrected datum position is calculated. Thereby, it is possible to cancel the error of the datum position of each spot image when there is no wavefront aberration which is caused by the deviation in the optical axis of the light incident into the optical characteristic measurement apparatus 590. Thus, it is possible to obtain the wavefront aberration with high accuracy.

Returning to FIG. 26, in step 576, the determination is made of whether or not measurement of the wavefront aberration at all measurement points is completed by determining whether or not the counter value n is equal to or greater than the total number N (N=33 in this case) of the measurement point. In this case, since only measurement of the wavefront aberration at the first measurement point has ended, the determination result is negative. Then, the procedure advances to step 578, the counter value n is incremented by one, and the procedure returns to step 568.

Subsequently, until the determination result in step 576 is positive, the processing of a loop of steps 568→570→572→574→576→578 is repeated. Thereby, the wavefront aberration measurement is performed at the 2nd to 33rd measurement points within the field of the projection optical system PL, that is, at the measurement points at the conjugate positions of the pinhole patterns $PH_2$ to $PH_{33}$ in the projection optical system PL, and the wavefront aberration related to the light, which passes through each of the pinhole patterns $PH_2$ to $PH_{33}$, is calculated, and stored in a memory not shown in the drawing.

When the wavefront aberration measurement at all measurement points is completed and the determination result in step 576 is positive, the procedure advances to next step 580.

In step 580, the determination is made of whether or not the measurement is completed when the illumination light IL is to be a V polarized light (a linearly polarized light having the polarization direction in the Y axis direction). In this case, since only the measurement of the H polarized light has ended, the determination result in step 580 is negative, and the procedure returns to step 536 in FIG. 25.

In step 536, the ½ wavelength plate of the polarization control unit 502 is rotated by 90 degrees, and the polarization direction of the laser beam LB is changed by 90 degrees. With this operation, the illumination light IL is set to be a V polarized light. Then, in step 538, the optimal Z position of the wafer stage WST is newly searched for. Here, the reason why the optimal Z position is searched for again is that the wavefront corresponding to each measurement point changes due to the change in the polarization direction of the illumination light IL, and also the optimal Z position is likely to change due to the change in the wavefront. In steps 540 to 544, and steps 552 to 576 in FIG. 26, the pupil image and the wavefront at each measurement point corresponding to general illumination aperture diaphragm 506D when the illumination light IL is set to be the V polarized light are measured. Then, when the measurement of the V polarized light is completed in this manner, the determination result in step 580 is positive, and the procedure advances to step 582 in FIG. 27.

Figure 27:
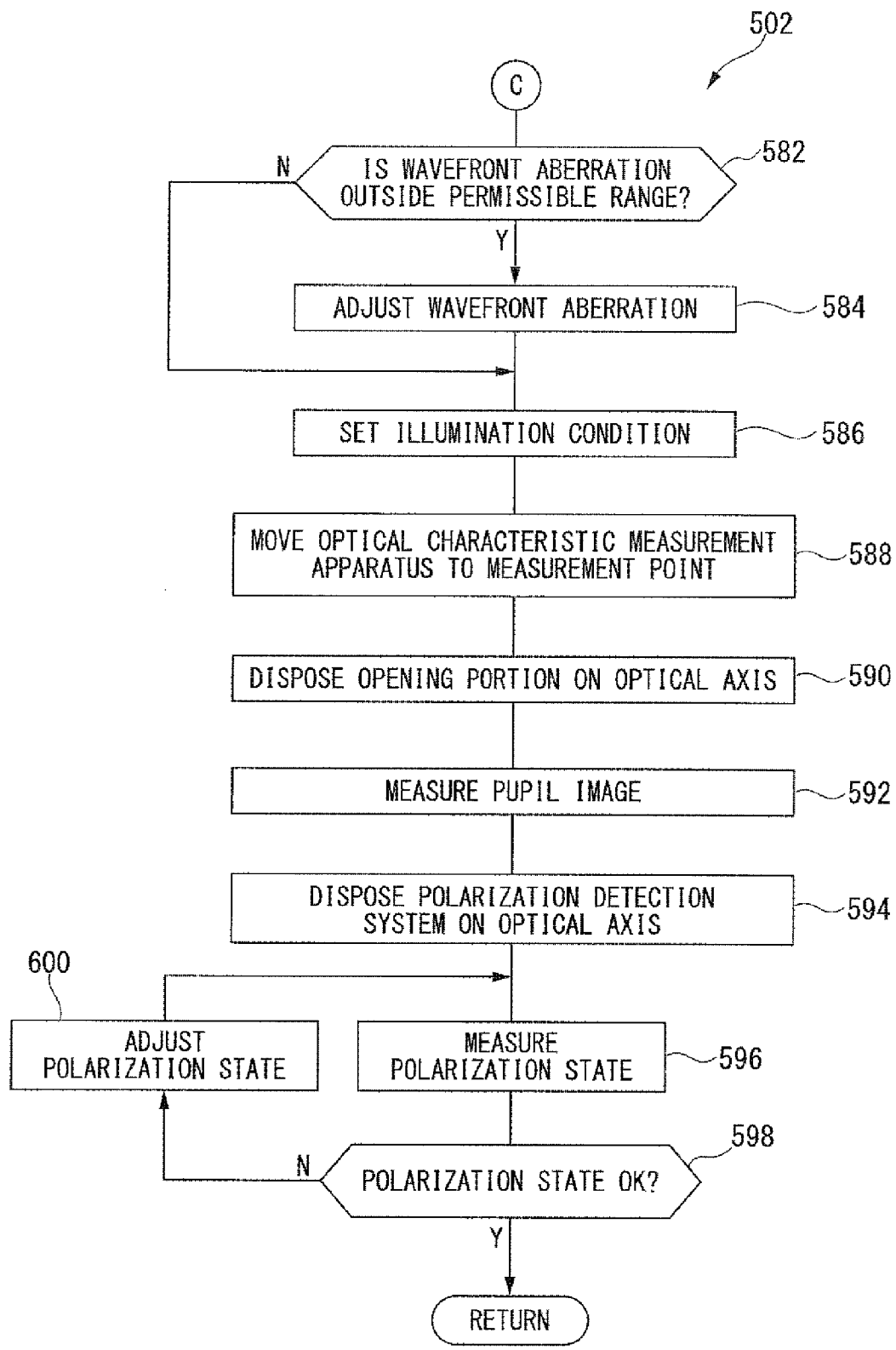
FIG. 27 is a flowchart illustrating the process of measuring the optical characteristics.

In step 582 in FIG. 27, on the basis of the data of the wavefront aberration at N (in this case, 33) measurement points within the field of the projection optical system PL obtained above, the determination is made of whether or not there is the measurement point at which the wavefront aberration of the projection optical system PL is outside a permissible range. Then, if the determination result is positive, the procedure advances to step 584, and adjustment of the wavefront aberration of the projection optical system PL is performed by driving a lens element through the imaging characteristic correction controller 551 such that the wavefront aberration generated at present is reduced, on the basis of the measurement results of the wavefront aberration of the projection optical system PL. The adjustment is set on the basis of the illumination condition that is set on actual exposure. Incidentally, depending on circumstances, the lens element of the projection optical system PL may be moved within the XY plane or may be exchanged by hand.

After the determination result is negative in step 582, or after the procedure in step 584 is performed, in step 586, an illumination condition that is applied to actual exposure is set. Specifically, the polarization control unit 502 makes the polarization direction of the laser beam LB be the H polarization, polarization conversion member 503A is disposed on the optical path of the illumination light IL by rotating the polarization conversion unit 503, and an annular illumination aperture diaphragm 506A is disposed on the optical path of the illumination light IL by rotating the illumination system aperture diaphragm plate 506 by the driving device 507. Then, in step 588, the optical characteristic measurement apparatus 590 is moved to the measurement point, and in step 590, an opening portion 597 of the optical system unit 593 is disposed on the optical path, and then in step 592, the pupil image is measured. In this case, since the annular illumination aperture diaphragm 506A is disposed on the optical path of the illumination light IL, the pupil image also has an annular shape. Here, the captured image data IMD2 of the pupil image is acquired, and the position and size of the pupil image on the light receiving surface of the CCD 595a, the intensity distribution of the pupil images, or the like is detected on the basis of the captured image data IMD2, and the detection results are stored in a memory.

In step 594, the polarization detection system 599 is disposed on the optical axis AX1 by rotating the optical system unit 593 in the optical characteristic measurement apparatus 590, and in step 596, a polarization state of the illumination light IL is measured.

In the present embodiment, the annular illumination aperture diaphragm 506A is selected as the illumination aperture diaphragm of the illumination optical system 512. In this case, the illumination light IL is to be a linearly polarized light of which a polarization direction is in a circumferential direction of a circle having the optical axis AX as the center. Thus, on the basis of the position and size of the pupil image that have been measured in step 592 above, a region on the light receiving surface of the CCD 595a is divided, and the polarization direction is measured for each divided region on the basis of the calculated values of the Stokes parameters.

In step 598, the determination is made of whether or not a polarization state of the illumination light IL is a desired state (that is, a linearly polarized light in the circumferential direction of a circle having the optical axis AX as the center), and if the determination result is positive, the processing of subroutine 502 ends, and if the determination result is negative, the procedure advances to step 600, in which the polarization state of the illumination light IL is adjusted by adjusting a rotation amount of the wave plate of the polarization control unit 502 or the like, and then the procedure returns to step 596. That is, until the determination result is positive in step 598, the processing and determination of steps 596→598→600 are repeated.

After the determination result in step 598 is positive, the processing of subroutine 502 ends, and the procedure advances to step 504 in FIG. 24.

In step 504, the measurement reticle RT, which is loaded on the reticle stage RST through the reticle loader not shown in the drawing, is unloaded and the reticle R, on which a pattern to be transferred is formed, is loaded on the reticle stage RST.

In step 506, reticle alignment and baseline measurement are performed in the procedure similar to that of a conventional scanning stepper. The reticle alignment uses the reticle alignment system described above and a reference mark plate not shown in the drawing. The baseline measurement uses the alignment detection system AS and the reference mark plate.

In step 508, the wafer on the wafer stage WST is replaced using the wafer loader not shown in the drawing (but when a wafer is not loaded on the wafer stage WST, a wafer is simply loaded).

In step 510, alignment (that is, for example, wafer alignment using the EGA method, or the like) is performed on the wafer W. As a result of the wafer alignment, array coordinates of a plurality of shot regions on the wafer W are obtained with good accuracy.

In step 512, on the basis of the results of the wafer alignment, step-and-scan exposure is performed by repeating the operations of: an operation in which the wafer stage WST is moved to a scanning starting position (an acceleration starting position) for exposure of each shot region on the wafer W; and an operation in which the reticle R is illuminated with the illumination light IL and a pattern of the reticle R is transferred onto the shot region on the wafer W while relatively scanning the reticle stage RST and the wafer stage WST synchronously in the Y axis direction. In the exposure, exposure with high resolution is achieved.

During the relative scanning, in particular, during the scanning exposure, position control of the reticle stage RST and the wafer stage WST is performed so as to keep a positional relationship between the reticle stage RST and the wafer stage WST appropriate, on the basis of information on the XY position of the reticle stage RST detected by the reticle interferometer 516, position information on the wafer stage WST detected by the wafer interferometer 518, and the Z position of the wafer W detected by the multipoint focus position detection system (521, 522), leveling information, and the like.

In step 514, the determination is made of whether or not exposure of the planned number of wafers (that is, for example, a single lot) is completed. If the determination result is negative, the procedure returns to step 508, and then until the determination result in step 514 is positive, the processing and determination of a loop of steps 508→510→512→514 are repeatedly performed, thereby performing exposure on each wafer.

Then, when exposure of the planned number of wafers is completed, the determination result in step 514 is positive, and a series of processing in the current routine ends.

As described above, according to the present embodiment, there is provided the optical system unit 593 which has a plurality of optical systems. The optical systems include: the micro lens array 598 that converts the illumination light IL, which passes through the illumination optical system 512 and the projection optical system PL, such that the polarization state of the illumination light IL, the wavefront aberration of the projection optical system PL, and the like can be measured; the polarization detection system 599; and the like. Further, in the present embodiment, the plurality of pinholes formed on the measurement reticle RT has a structure in which the surface plasmons are effectively excited. Hence, the spherical waves with high accuracy and high intensity are emitted from the measurement reticle RT, and thus it is possible to perform measurement with a high S/N ratio with high accuracy.

The light, which is transmitted through the projection optical system PL, is converted into parallel light in the collimator optical system 592, and is thereafter incident into the micro lens array 598. The detection target wavefront of the incident light may be an ideal wavefront, that is, may have a deviation from the wavefront which occurs when there is no aberration in the projection optical system. In this case, the deviation is represented as a positional deviation of the light condensing position of the detection target wavefront from the light condensing position of the ideal wavefront on a light condensing position detection section. The main control device 520 is able to calculate the wavefront aberration of the projection optical system PL, on the basis of the positional deviation between the light condensing points of the respective lenses of the 2-dimensional lens array 598. By measuring the positional deviation between the measurement points of the detection target wavefront relative to the respective light condensing points of the ideal wavefront at one point on the imaging plane based on the projection optical system PL, it is possible to calculate spherical aberration and astigmatism as the aberrations of the projection optical system PL. Further, at each of a plurality of points in the imaging plane of the projection optical system PL, the positional deviation between the respective measurement points of the detection target wavefront relative to the respective light condensing points of the ideal wavefront is measured. From the measurement results, it is possible to calculate the comatic aberration, the image field curvature, the distortion, and the astigmatism as the aberrations of the projection optical system PL.

The structure (plasmon excitation structure), in which the surface plasmons are effectively excited, can also be applied to optical elements other than the measurement reticle RT. For example, the structure can be applied to the marking plate 591 which has the opening 591a shown in FIG. 29A. The plasmon excitation structure can also be applied to the other optical elements.

The number of pinholes, which are formed on the measurement reticle RT, is not limited to 33. In another embodiment, the number of pinholes may be at least one, and can be set as a number other than 33. When there is one pinhole, it is possible to omit the marking plate 591 shown in FIGS. 29A and 29B.

The optical characteristic, which is measured by using the optical elements having the plasmon excitation structure, is not limited to the wavefront aberration. By using the optical elements having such a structure, it is possible to measure optical characteristics other than the wavefront aberration.

In the present embodiment, the polarization state of the illumination light IL on a pattern image plane of the exposure apparatus 500 can be measured using the optical, characteristic measurement apparatus 590. Hence, when polarized illumination is performed in order to improve the resolution, it is possible to confirm whether or not the polarization state of the illumination light IL is a desired state, and thus it is possible to reliably perform high-accuracy exposure.

Further, in the present embodiment, on the basis of the light receiving results obtained from the regions within the light receiving surface of the CCD 595 that are conjugate to a plurality of different regions within the pupil plane of the projection optical system PL, the polarization state of the illumination light IL in the regions are measured. In such a manner, when the polarization directions of the illumination light IL are different in the different regions on the pupil plane of the projection optical system PL as in the polarized illumination, it is possible to reliably measure the polarization directions in each of the regions.

Furthermore, in the present embodiment, the polarization detection system 599 in the optical system unit 593 of the optical characteristic measurement apparatus 590 includes a polarization beam splitter 599B and a ¼ wavelength plate 599A that rotate relatively to each other around the optical axis of the illumination light IL. With this arrangement, the amount of the illumination light IL, which passes through the polarization detection system 599, changes in accordance with the polarization state due to the change in a relative rotation amount between both of them. Therefore, when measuring the amount of the illumination light IL which passes through the polarization detection system 599 while changing the relative rotation amount, it is possible to measure the polarization state of the illumination light IL.

In addition, the numerical aperture NA of the projection optical system PL can also be measured by using the optical characteristic measurement apparatus 590. A diffuser is disposed on the optical path of the illumination light IL within the illumination optical system 512 so as to make a diameter of a beam passing though the diffuser larger than the numerical aperture of the projection optical system PL, and the opening portion 597 of the optical characteristic measurement apparatus 590 is disposed on the optical axis AX1. Then, the beam, which passes through the pupil of the projection optical system PL, reaches the CCD 595a. Consequently, from the imaging result of the CCD 595a, it is possible to calculate the size of the pupil of the projection optical system PL, and thus it is also possible to calculate the numerical aperture of the projection optical system PL. When the numerical aperture of the projection optical system PL can be calculated, it is possible to calculate a coherence factor (the so-called illumination c) of the illumination optical system 512, from the measurement results of a pupil image (a light source image) which are obtained when the diffuser is removed.

In recent years, the resolution of the exposure apparatus has been improved to cope with a decrease in size of the pattern formed on a device. In order to improve the resolution, it is necessary to shorten the wavelength of an exposure light (the illumination light IL in the above-mentioned embodiment), and it is preferable to increase the numerical aperture (NA) of a projection optical system. Then, a liquid-immersion-type exposure apparatus is proposed in which the resolution is improved by filling the space between a projection optical system provided in the exposure apparatus and a substrate (the wafer W in the above-mentioned embodiment) with a liquid and by substantially increasing the numerical aperture of the projection optical system. The liquid has a refractive index higher than that of gas.

A description will be given of a case where a measurement apparatus equivalent to the optical characteristic measurement apparatus 590 of the above-mentioned embodiment is applied to the liquid-immersion-type exposure apparatus.

Figure 30:
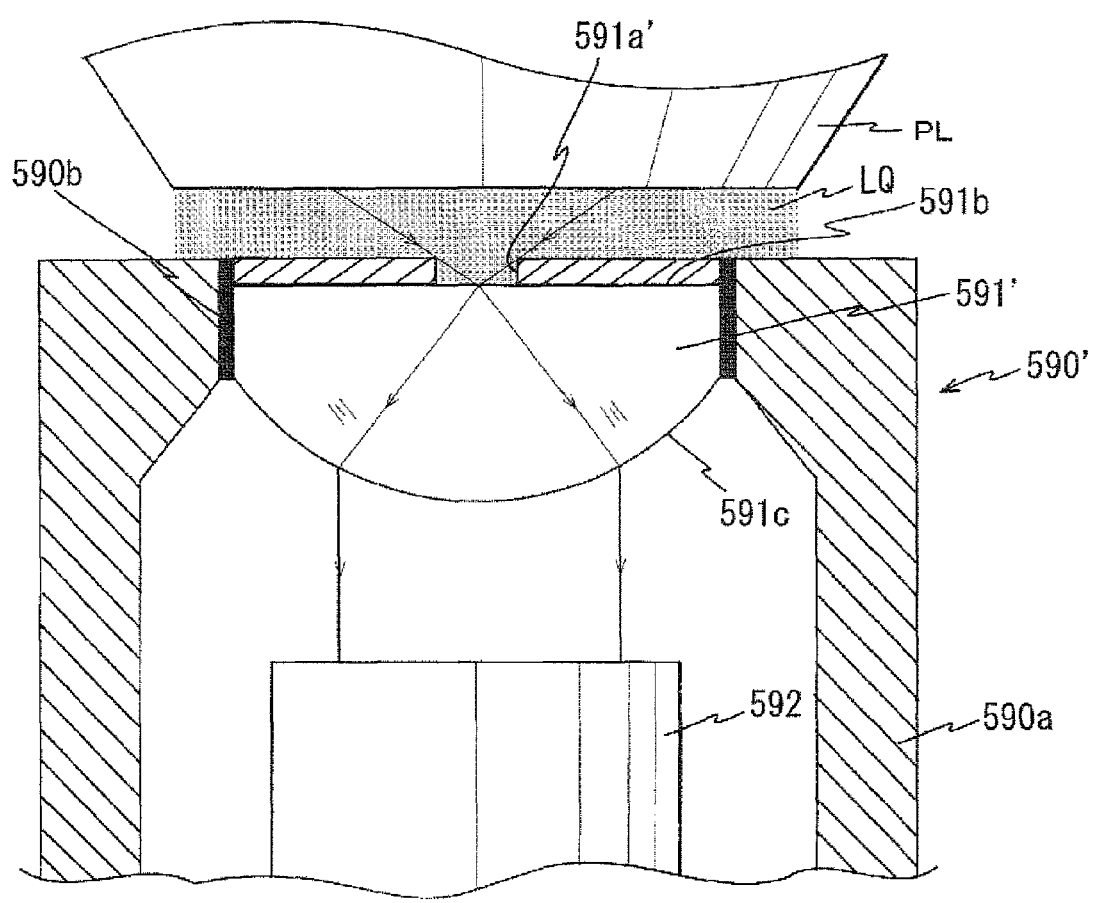
FIG. 30 is a diagram illustrating an example of a configuration of an optical characteristic measurement apparatus applied to a liquid-immersion-type exposure apparatus.

When the measurement apparatus (which is to be the optical characteristic measurement apparatus 590') that is equivalent to the optical characteristic measurement apparatus 590 is applied to the liquid-immersion-type exposure apparatus, as shown in FIG. 30, the marking plate 591' is preferably constituted by a planoconvex lens. The marking plate 591' includes a flat section (a flat surface) 591b that faces the projection optical system PL side, and a curved surface portion 591c that faces the collimator optical system 592 side and has a predetermined curvature. The marking plate 591' is formed of a material, which transmits illumination light, such as quartz or fluorite.

A light shielding film is formed on the surface of the flat section 591b of the marking plate 591', and a circular opening 591a' is formed in the center portion of the light shielding film. Moreover, in order to prevent a liquid LQ from entering into the optical characteristic measurement apparatus 590', waterproof (liquid-proof) measures are taken with a seal material 590b or the like between the marking plate 591' and the casing 590a of the optical characteristic measurement apparatus 590'. A liquid repellant film (a water repellant coat) is formed on the opening 591a' of the marking plate 591' and the region around the opening 591a'.

In a state where liquid LQ is supplied to the space between the projection optical system. PL and the upper surface of the marking plate 591', an exposure light incident into the projection optical system PL is not totally reflected at the tip portion of the projection optical system PL, and passes though the projection optical system PL and is incident into liquid LQ. As shown in FIG. 30, in the exposure light incident into liquid LQ, only the exposure light that is incident into the opening 591a' is incident into the marking plate 591'. In this case, a refractive index of the planoconvex lens constituting the marking plate 591' is approximately the same as that of liquid LQ or higher than that of liquid LQ. Hence, the exposure light incident into the opening 591a' is incident into the marking plate 591' without reflecting off the flat section 591b even when an incident angle of the exposure light incident into the opening 591a' is large. Further, the exposure light incident into the marking plate 591' is deflected by the curved surface portion 591c, and then is emitted to the collimator optical system 592. In this manner, even when the space between the projection optical system PL and the marking plate 591' is filled with the liquid, which has a refractive index higher than that of gas, so as to increase the numerical aperture of the projection optical system, it is possible to guide the exposure light into the collimator optical system 592 through the marking plate 591' constituted by a planoconvex lens.

Figure 31:
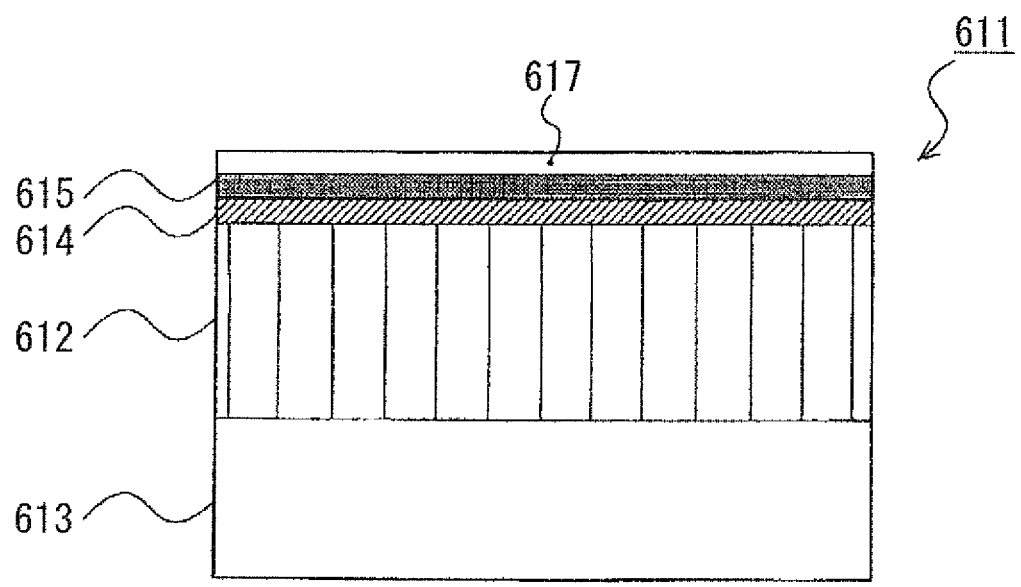
FIG. 31 is a cross-sectional view illustrating a schematic configuration of a light receiving unit (image capturing unit) according to a modification example.

FIG. 31 shows a modification example of a light receiving unit (image capturing unit) having a CCD. In FIG. 31, a unit 611 has a FOP 612 and a CCD 613. The FOP 612 is an optical substrate which bundles a plurality of optical fibers with a regular interval and is formed in a planar shape, and is made of a material through which ultraviolet light cannot be transmitted and visible light can be transmitted. The optical fibers of the FOP 612 are arranged in parallel so as to extend in the vertical direction of FIG. 31. The beam, which is incident from the incident surface of the FOP 612, propagates through each optical fiber, and is guided to the emission surface side of the FOP 612.

A wavelength selection film 614, a fluorescent film 615, and a protective film 617 are sequentially laminated on the incident surface of the FOP 612. On the other hand, the CCD 613 is mounted on the emission surface of the FOP 612. In addition, from the viewpoint of preventing the lateral resolution of the FOP 612 from being lowered, the total thickness of the wavelength selection film 614 and the fluorescent film 615 formed on the incident surface of the FOP 612 is set to be equal to or less than the diameter of each optical fiber in the FOP 612.

The wavelength selection film 614 is formed between the FOP 612 and the fluorescent film 615, and has a characteristic that transmits visible light and reflects ultraviolet light. As an example, the wavelength selection film 614 is constituted by a dielectric multilayer mirror.

The fluorescent film 615 produces fluorescence by ultraviolet light, and has a function of converting ultraviolet-range measurement light into visible-range measurement light.

The protective film 617 covers the surface of the fluorescent film 615. The protective film 617 has at least one of water resistance and water repellency. The protective film 617 has a function of preventing liquid from permeating and protecting lower layer films from air and moisture vapor.

The CCD 613 has a light receiving surface on which a plurality of light receiving elements (not shown in the drawing) is two-dimensionally arranged. The light receiving surface of the CCD 613 is adjacent to the emission surface of the FOP 612. In addition, in the present embodiment, it is possible to directly fix the FOP 612 onto the light receiving surface of the CCD 613 by means of an adhesive or the like without mounting a cover glass, a filter, or the like on the CCD 613.

The unit 611 of FIG. 31 is irradiated with, for example, short-wavelength ultraviolet light (ArF excimer laser, KrF excimer laser, or the like). The short-wavelength ultraviolet light is incident onto the fluorescent film 615. The fluorescent film 615 produces visible-range fluorescence in accordance with the intensity of the incident short-wavelength ultraviolet light. The fluorescence is scarcely attenuated and is transmitted through the wavelength selection film 614, and is incident onto the FOP 612. Then, the measurement light (fluorescence), which is emitted from the FOP 612, is measured by the CCD 613. Meanwhile, the short-wavelength ultraviolet light, which is transmitted through the fluorescent film 615, is actually reflected by the wavelength selection film 614.

In the unit 611 of FIG. 31, the incidence of the short-wavelength ultraviolet light onto the FOP 612 is mostly cut off by the wavelength selection film 614. Hence, it is possible to prevent the FOP 612 from being deteriorated by the short-wavelength ultraviolet light. The ultraviolet-range measurement light is converted into visible-range fluorescence by the fluorescent film 615, and is transmitted through the wavelength selection film 614. As a result, the unit 611 is able to reliably perform measurement by using the fluorescence.

Further, in the present embodiment, either one of the short-wavelength ultraviolet light, which is incident from the light source, and the short-wavelength ultraviolet light, which is reflected by the wavelength selection film 614, contributes to occurrence of the fluorescence. Therefore, it is possible to easily obtain the fluorescence with a high intensity through the fluorescent film 615, and thus it is possible to easily decrease the thickness of the fluorescent film 615. Further, since the base material of the fluorescent film 615 is formed of fluoride, the fluorescent film 615 has high durability to the short-wavelength ultraviolet light. Further, in the present embodiment, the fluorescent film 615 is formed in a vacuum deposition method. Therefore, for example, it is possible to obtain the fluorescent film 615 of which the fluorescence is less likely to be scattered and optical characteristics are favorable compared with a case where the phosphor particles are mixed with binders and are spread to form the fluorescent film 615.

Further, in the present embodiment, the fluorescent film 615 is covered with the protective film 617, and the fluorescent film 615 is prevented from being deteriorated. For example, in a case where the light receiving unit (image capturing unit) is used in the optical characteristic measurement apparatus which is mounted on the liquid-immersion-type exposure apparatus, the space between the detection target optical system (the projection optical system of the exposure apparatus) and the FOP 612 is filled with a liquid such as water. In FIG. 31, the protective film 617 and the fluorescent film 615 are protected from the liquid. Further, in a case of being irradiated with the ultraviolet light in air, oxidation or hydroxylation occurs at the interface between air and the fluorescent film 615 of fluoride, and the optical performance is deteriorated. However, in FIG. 31, the protective film 617 prevents the corresponding fluorescent film 615 from being deteriorated. Furthermore, when the protective film 617 has a sufficient film strength, it is also possible to easily remove the surface contamination through a wiper.

The unit 611 shown in FIG. 31 has the FOP 612, and thus the large region within the image plane of the detection target optical system can be detected once with high accuracy. Hence, it is possible to employ a configuration in which a relay optical system or the like is simplified or omitted, and this can contribute to a decrease in size of the apparatus. Further, the fluorescent film 615 which has a thickness equal to or less than the diameter of each optical fiber constituting the FOP 612 is formed on the incident surface of the FOP 612. The lateral resolution of the FOP 612 is prevented from being lowered. Further, the ultraviolet-range measurement light is converted into the visible-range measurement light. As a result, it is possible to reliably guide the visible-range measurement light into an imaging element 613. Furthermore, the fluorescent film 615 converts the ultraviolet-range measurement light into the visible-range measurement light, thereby reducing occurrence of coherent noise. Consequently, in the unit 611, a rotatable diffuser panel and the like can be simplified or omitted, and thus an advantageous decrease in the size of the apparatus can be achieved.

Further, in the above-mentioned embodiment shown in FIG. 22 or the like, the description was given of the case where the optical characteristic measurement apparatus 590 is used for measurement of optical characteristics that is performed before exposure of the wafer W in one lot. It is apparent that the optical characteristic measurement apparatus 590 can be used at the time of periodic maintenance after assembly of the exposure apparatus, and at the time of adjustment of the projection optical system PL when making the exposure apparatus. Incidentally, on the adjustment of the projection optical system PL when making the exposure apparatus, in addition to position adjustment of a part of lens elements constituting the projection optical system PL that is performed in the above-mentioned embodiment, position adjustment of other lens elements, reprocessing of lens elements, exchange of lens elements, and the like can be performed.

Further, in the above-mentioned embodiment, the aberration of the light receiving optical system, such as the collimator optical system 592 inside the optical characteristic measurement apparatus 590, is to be small enough to be ignored. However, in such a case where the wavefront aberration measurement with higher accuracy is performed, the wavefront aberration of only the light receiving optical system may be measured in advance at any time before the wavefront aberration is calculated. Such wavefront aberration measurement of only the light receiving optical system can be realized, by irradiating a pattern plate with the illumination light IL emitted from the projection optical system PL and measuring the wavefront aberration as described above, in a state where the pattern plate is provided in the vicinity of the marking plate 591 and the opening 591a is further restricted by the pinhole pattern of the pattern plate. On the pattern plate, the pinhole pattern, which has a size large enough to generate a spherical wave by irradiation of the illumination light IL through the projection optical system PL, is formed. Then, when the wavefront aberration of the projection optical system PL is calculated, the wavefront aberration of only the light receiving optical system may be used as a correction value.

In the above-mentioned embodiment, the optical characteristic measurement apparatus 590 is permanently provided on and fixed to the wafer stage WST. In another embodiment, the optical characteristic measurement apparatus 590 may be detachable from the wafer stage WST. Further, another stage different from the wafer stage may be provided, and an optical characteristic measurement apparatus similar to the optical characteristic measurement apparatus 590 may be disposed on this another stage.

The light source 501 of the exposure apparatus in the above-mentioned embodiment is not limited to a pulsed ultraviolet light source such as an $F_2$ laser light source (157 nm), an ArF excimer laser light source (193 mm), and a KrF excimer laser light source (248 nm), and an ultrahigh pressure mercury lamp that emits an emission line such as the g-line (a wavelength of 436 nm) or the i-line (a wavelength of 365 nm) may also be used. In addition, harmonic waves may be used. The harmonic waves are generated by amplifying infrared-range or visible-range single wavelength laser light through a fiber amplifier, and are wavelength-converted into ultraviolet light by using a nonlinear optical crystal. The laser light is generated from a DFB semiconductor laser or a fiber laser. The fiber amplifier is doped with, for example, erbium (or both of erbium and ytterbium). In addition, the magnification of the projection optical system is not limited to a reduction system, and an equal magnifying system or a magnifying system may be used.

In the present embodiment, a scanning-type exposure apparatus was described. In another embodiment, as the exposure apparatus, it may be possible to use a different apparatus such as a step-and-repeat apparatus, a step-and-scan apparatus, or a step-and-stitching apparatus.

The usage of the exposure apparatus is not limited to the exposure apparatus for manufacturing semiconductors. The present invention can also be applied to, for example, the exposure apparatus for liquid crystal that transfers a liquid crystal display device pattern onto a square shaped glass plate, and the exposure apparatus used for manufacturing organic EL, thin-film magnetic heads, micromachines, DNA chips or the like. In addition, the present invention can also be applied to the exposure apparatus that transfers a circuit pattern onto a glass substrate, a silicon wafer, or the like, not only when producing micro devices such as semiconductor devices, but also when producing a reticle or a mask used in the exposure apparatuses such as an optical exposure apparatus, an EUV exposure apparatus, an X-ray exposure apparatus, or an electron beam exposure apparatus.

It should be noted that the prerequisites of the above-mentioned embodiments can be appropriately combined. Further, some components may be not used. Further, in the allowable range of the laws, the disclosures of all the publications and the U.S. patents of the exposure apparatus and the like cited in the above-mentioned embodiments and the modification examples are incorporated herein by reference.

What is claimed is:

1. An optical element comprising:
   an incident surface that is irradiated with irradiation light;
   an emission surface of which at least a part faces a direction opposite to the incident surface; and
   a metal film that has a hole formed to connect the incident surface and the emission surface;
   wherein the incident surface includes a first surface, which is disposed around an end of the hole on the incident surface side and has an inner edge connected to an inner surface of the hole, and a second surface which is disposed around the first surface and forms a discontinuous portion between the second surface and an outer edge of the first surface;
   a distance between the inner edge and the outer edge is determined depending on a wavelength of surface plasmons such that an intensity of light, which is emitted from the hole to the emission surface side, is increased due to interference between surface plasmons, which are excited at the inner edge due to the irradiation of the irradiation light and travel toward the hole, and surface plasmons which travel from the discontinuous portion toward the hole;
   the inner edge includes a first corner which is formed by the first surface and the inner surface of the hole; and
   the discontinuous portion includes a second corner which is formed by the first surface and the second surface.

2. The optical element according to claim 1, wherein the surface plasmons, which travel from the discontinuous portion toward the hole, include surface plasmons which are excited at the inner edge due to the irradiation of the irradiation light and are reflected by the discontinuous portion.

3. The optical element according to claim 2,
   wherein the second surface is disposed around the first surface so as to face an inner side with respect to a radial direction centered on the hole; and
   wherein at least some of the surface plasmons, which are excited at the inner edge, are reflected by the discontinuous portion between the outer edge of the first surface and the second surface facing the inner side.

4. The optical element according to claim 3, wherein when a distance between the inner edge and the outer edge is L and a wavelength of the surface plasmons is $\lambda_{sp}$, the following condition is satisfied:

$$L=m\cdot\lambda_{sp}/2 \text{ (}m\text{ is a positive odd number).}$$

5. The optical element according to claim 2,
wherein the second surface is disposed around the first surface so as to face an outer side with respect to a radial direction centered on the hole; and
wherein at least some of the surface plasmons, which are excited at the inner edge, are reflected by the discontinuous portion between the outer edge of the first surface and the second surface facing the outer side.

6. The optical element according to claim 5, wherein when a distance between the inner edge and the outer edge is L and a wavelength of the surface plasmons is $\lambda_{sp}$, the following condition is satisfied:

$$L=m\cdot\lambda_{sp}/2 \text{ (}m\text{ is a positive odd number).}$$

7. The optical element according to claim 1, wherein the surface plasmons, which travel from the discontinuous portion toward the hole, include surface plasmons which are excited at the discontinuous portion due to the irradiation of the irradiation light.

8. The optical element according to claim 7,
wherein the second surface is disposed around the first surface so as to face an outer side with respect to a radial direction centered on the hole, and
wherein the surface plasmons are excited at the discontinuous portion between the outer edge of the first surface and the second surface facing the outer side, due to the irradiation of the irradiation light.

9. The optical element according to claim 8, wherein when a distance between the inner edge and the outer edge is L and a wavelength of the surface plasmons is $\lambda_{sp}$, the following condition is satisfied:

$$L=m\cdot\lambda_{sp}/2 \text{ (}m\text{ is a positive odd number).}$$

10. The optical element according to claim 1, wherein the incident surface includes a third surface which is disposed around the second surface and is substantially parallel with the first surface.

11. The optical element according to claim 1, further comprising a transparent member that is capable of transmitting the irradiation light and has a surface on which the metal film is formed,
wherein the metal film is irradiated with the irradiation light through the transparent member.

12. The optical element according to claim 11;
wherein the transparent member is a solid immersion lens; and
wherein a surface of the solid immersion lens on which the metal film is formed is a focal plane of the solid immersion lens.

13. An illumination device comprising:
the optical element according to claim 1; and
an optical system that irradiates the incident surface of the optical element with the irradiation light; and
wherein an object is illuminated with light which is emitted from the hole of the optical element.

14. A measurement apparatus comprising:
the illumination device according to claim 13;
a detection device that detects reflected light of spherical waves which is emitted from the illumination device and with which a surface of an object is irradiated; and
an arithmetic device that calculates a wavefront aberration of the surface of the object on the basis of a detection result of the detection device.

15. A measurement apparatus comprising:
the illumination device according to claim 13;
a detection device that detects measurement light which is emitted from the illumination device and travels through an object; and
an arithmetic device that calculates optical characteristics of the object on the basis of a detection result of the detection device.

16. An exposure apparatus that transfers a pattern image onto a substrate, the exposure apparatus comprising:
the optical element according to claim 1;
an optical system that irradiates the optical element with light; and
a detection device that detects light which is emitted from the optical element.

17. An exposure method comprising:
measuring predetermined optical characteristics by using the optical element according to claim 1; and
transferring a pattern image onto a substrate on the basis of a measurement result of the optical characteristics.

18. An optical element comprising:
an incident surface that is irradiated with irradiation light;
an emission surface of which at least a part faces a direction opposite to the incident surface; and
a metal film that has a hole formed to connect the incident surface and the emission surface;
wherein the incident surface includes a first surface, which is disposed around an end of the hole on the incident surface side and has an inner edge connected to an inner surface of the hole, and a second surface which is disposed around the first surface and forms a discontinuous portion between the second surface and an outer edge of the first surface;
wherein the inner edge includes a first corner which is formed by the first surface and the inner surface of the hole;
wherein the discontinuous portion includes a second corner which is formed by the first surface and the second surface;
wherein the second surface is disposed around the first surface so as to face an inner side with respect to a radial direction centered on the hole;
wherein the optical element further includes a transparent member that is capable of transmitting the irradiation light and has a surface on which the metal film is formed;
wherein the metal film is made of aluminum;
wherein the transparent member is made of silica glass;
wherein when a distance between the inner edge and the outer edge is L, the following condition is satisfied:

$$L=m\cdot 43 \text{ (nm) (}m\text{ is a positive odd number); and}$$

wherein the metal film is irradiated with the irradiation light through the transparent member.

19. An optical element comprising:
an incident surface that is irradiated with irradiation light;
an emission surface of which at least a part faces a direction opposite to the incident surface; and
a metal film that has a hole formed to connect the incident surface and the emission surface;
wherein the incident surface includes a first surface, which is disposed around an end of the hole on the incident surface side and has an inner edge connected to an inner surface of the hole, and a second surface which is disposed around the first surface and forms a discontinuous portion between the second surface and an outer edge of the first surface;

wherein the inner edge includes a first corner which is formed by the first surface and the inner surface of the hole;

wherein the discontinuous portion includes a second corner which is formed by the first surface and the second surface;

wherein the second surface is disposed around the first surface so as to face an outer side with respect to a radial direction centered on the hole; and wherein the optical element further includes a transparent member that is capable of transmitting the irradiation light and has a surface on which the metal film is formed;

wherein the metal film is made of aluminum;

wherein the transparent member is made of silica glass;

wherein when a distance between the inner edge and the outer edge is L, the following condition is satisfied:

$$L = m \cdot 43 \text{ (nm)} \quad (m \text{ is a positive odd number}); \text{ and}$$

wherein the metal film is irradiated with the irradiation light through the transparent member.

20. A photomask comprising:

an incident surface that is irradiated with exposure light;

an emission surface of which at least a part faces a direction opposite to the incident surface; and a metal film that has a hole formed to connect the incident surface and the emission surface;

wherein the incident surface includes a first surface, which is disposed around an end of the hole on the incident surface side and has an inner edge connected to an inner surface of the hole, and a second surface which is disposed around the first surface and forms a discontinuous portion between the second surface and an outer edge of the first surface;

a distance between the inner edge and the outer edge is determined depending on a wavelength of surface plasmons such that an intensity of the exposure light, which is emitted from the hole to the emission surface side, is increased due to interference between surface plasmons, which are excited at the inner edge due to the irradiation of the exposure light and travel toward the hole, and surface plasmons which travel from the discontinuous portion toward the hole;

the inner edge includes a first corner which is formed by the first surface and the inner surface of the hole; and the discontinuous portion includes a second corner which is formed by the first surface and the second surface.

21. The photomask according to claim 20, wherein the surface plasmons, which travel from the discontinuous portion toward the hole, include surface plasmons which are excited at the inner edge due to the irradiation of the exposure light and are reflected by the discontinuous portion.

22. The photomask according to claim 20, wherein the surface plasmons, which travel from the discontinuous portion toward the hole, include surface plasmons which are excited at the discontinuous portion due to the irradiation of the exposure light.

23. An exposure method comprising:

illuminating the photomask according to claim 20 with exposure light; and exposing a substrate with the exposure light from the photomask.

24. A device manufacturing method comprising:

exposing a substrate in the exposure method according to claim 13; and developing the exposed substrate.

* * * * *